(12) United States Patent
Yu et al.

(10) Patent No.: US 11,296,062 B2
(45) Date of Patent: Apr. 5, 2022

(54) THREE-DIMENSION LARGE SYSTEM INTEGRATION

(71) Applicant: Taiwan Semiconductor Manufacturing Company, Ltd., Hsinchu (TW)

(72) Inventors: Chen-Hua Yu, Hsinchu (TW); Tin-Hao Kuo, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 144 days.

(21) Appl. No.: 16/671,927

(22) Filed: Nov. 1, 2019

(65) Prior Publication Data
US 2020/0411488 A1    Dec. 31, 2020

Related U.S. Application Data

(60) Provisional application No. 62/866,227, filed on Jun. 25, 2019.

(51) Int. Cl.
*H01L 25/10* (2006.01)
*H01L 25/18* (2006.01)
*H01L 25/00* (2006.01)

(52) U.S. Cl.
CPC .......... *H01L 25/105* (2013.01); *H01L 25/18* (2013.01); *H01L 25/50* (2013.01); *H01L 2225/1035* (2013.01); *H01L 2225/1041* (2013.01); *H01L 2225/1058* (2013.01); *H01L 2225/1094* (2013.01)

(58) Field of Classification Search
CPC ..... H01L 23/538–5389; H01L 23/3142; H01L 21/565–566; H01L 25/105; H01L 25/18; H01L 2225/1035; H01L 2224/97; H01L 25/04–0756; H01L 25/165; H01L 2225/1041; H01L 2924/181
See application file for complete search history.

(56) References Cited

U.S. PATENT DOCUMENTS

| | | |
|---|---|---|
| 7,560,309 B1 | 7/2009 | Kao et al. |
| 8,945,985 B2 | 2/2015 | Kim et al. |
| 2019/0148338 A1* | 5/2019 | Watanabe ............... H01L 24/19 257/777 |
| 2020/0395281 A1* | 12/2020 | Chien .................. H01L 23/5389 |

FOREIGN PATENT DOCUMENTS

KR    20130036591 A    4/2013

* cited by examiner

*Primary Examiner* — Thanh Y. Tran
(74) *Attorney, Agent, or Firm* — Slater Matsil, LLP

(57) ABSTRACT

A package includes a building block. The building block includes a device die, an interposer bonded with the device die, and a first encapsulant encapsulating the device die therein. The package further includes a second encapsulant encapsulating the building block therein, and an interconnect structure over the second encapsulant. The interconnect structure has redistribution lines electrically coupling to the device die. A power module is over the interconnect structure. The power module is electrically coupled to the building block through the interconnect structure.

20 Claims, 26 Drawing Sheets

THREE-DIMENSION LARGE SYSTEM INTEGRATION

PRIORITY CLAIM AND CROSS-REFERENCE

This application claims the benefit of the U.S. Provisional Application No. 62/866,227, filed Jun. 25, 2019, and entitled "Three-Dimension Large System Integration;" which application is hereby incorporated herein by reference.

BACKGROUND

In some Three-Dimensional Integrated Circuits (3DIC), device dies are first bonded to an interposer, which is further bonded to a package substrate through solder regions to form a package. The resulting package is bonded to a printed circuit board. This structure, however, has high latency, and is not suitable for high-speed data communication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
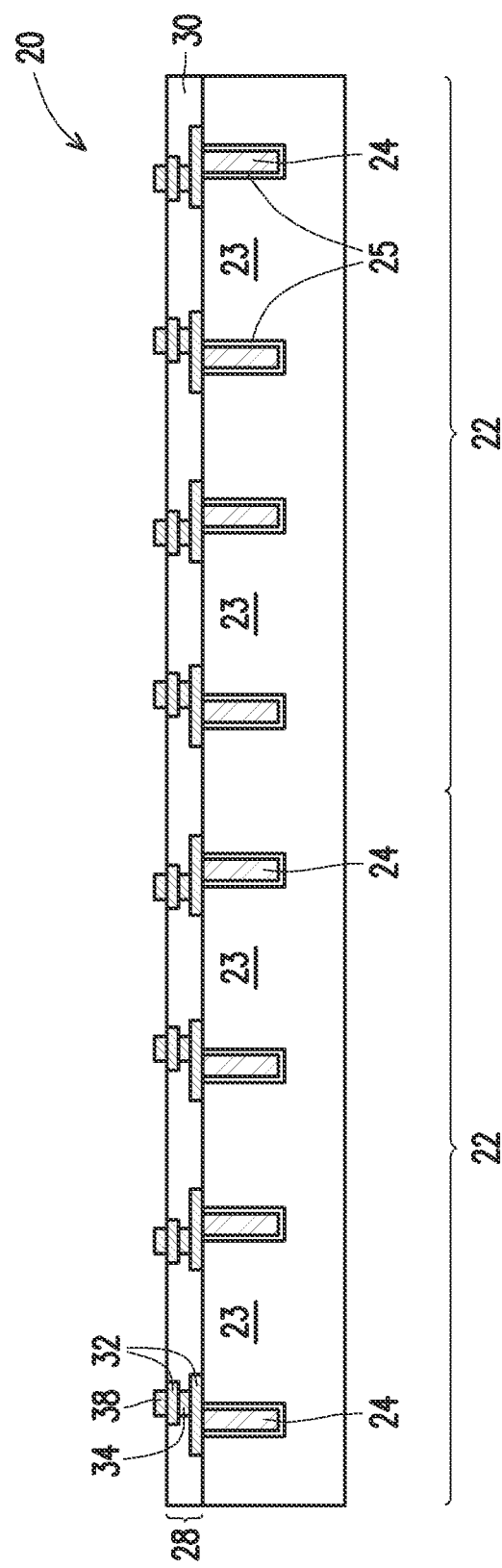
FIGS. 1 through 7 illustrate the cross-sectional views of intermediate stages in the formation of building blocks in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with some embodiments. The structure of the package is suitable for forming super-large packages such as those used for Artificial Intelligence (AI) Applications, 5G applications, or the like, which have demanding requirement for the speed of data communication. The intermediate stages in the formation of the package are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, a system package includes a plurality of building blocks and bare (device) dies, which are interconnected through redistribution lines. The redistribution lines, the building blocks, and bare dies form fan-out packages. Power modules are bonded to the fan-out packages, and are located on the opposing side of the redistribution lines than the building blocks and bare dies. In accordance with some embodiments, no package substrate and/or printed circuit board is used in the system package.

FIGS. 1 through 7 illustrate the cross-sectional views of intermediate stages in the formation of a building block in accordance with some embodiments of the present disclosure. The processes shown in FIGS. 1 through 7 are also reflected schematically in the process flow 200 shown in FIG. 30.

FIG. 1 illustrates a cross-sectional view of package component 20, which may be an interposer wafer, a package substrate strip, a device die wafer, or a package. Package component 20 includes a plurality of package components 22, which may be identical to each other. In accordance with some embodiments of the present disclosure, package components 22 are interposers, which are free from active devices (such as transistors and diodes) and passive devices therein. Throughout the description, package components 22 are alternatively referred to as interposers 22 hereinafter, while package components 22 may also be other types of package components including, and not limited to, device dies (which includes active devices and/or passive devices therein), package substrates, packages, or the like.

In accordance with some embodiments of the present disclosure, package component 20 includes substrate 23, which may be a semiconductor substrate such as a silicon substrate. Substrate 23 may also be formed of other semiconductor materials such as silicon germanium, silicon carbon, or the like. In accordance with alternative embodiments of the present disclosure, substrate 23 is a dielectric substrate. In accordance with these embodiments, interposer 20 may, or may not, include passive devices formed therein.

Through-Vias (TVs) 24 are formed to extend from the top surface of substrate 23 into substrate 23. Through-vias 24 are also sometimes referred as through-substrate vias, or through-silicon vias when substrate 23 is a silicon substrate. Insulation layers 25 are formed to electrically insulate through-vias 24 from substrate 23. Interconnect structure 28 is formed over substrate 23, and is used to electrically interconnect the integrated circuit devices (if any), and is connected to through-vias 24. Interconnect structure 28 may include a plurality of dielectric layers 30. In accordance with some embodiments of the present disclosure, dielectric layers 30 are formed of silicon oxide, silicon nitride, silicon carbide, silicon oxynitride, combinations thereof, and/or multi-layers thereof. Alternatively, dielectric layers 30 may include one or more low-k dielectric layer having a low dielectric constant(s) (k value(s)). The k values of the low-k dielectric materials in dielectric layers 30 may be lower than about 3.0, or lower than about 2.5, for example. Metal lines 32 are formed in dielectric layers 30. Vias 34 are formed between, and interconnecting, the overlying and underlying metal lines 32.

In accordance with some embodiments, metal lines 32 and vias 34 are formed using damascene processes, which include forming trenches and via openings in dielectric layers 30, depositing a conductive barrier layer (such as TiN, Ti, TaN, Ta, or the like), and filling a metallic material (such as copper) to fill the rest of the trenches and via openings. A planarization process such as a Chemical Mechanical Polish (CMP) process or a mechanical grinding process is then performed to remove excess portions of the conductive barrier layer and the metallic material, leaving metal lines 32 and vias 34. By using the damascene processes, the metal lines may be formed very narrow, for example, with pitches (viewed from the top of the structure) smaller than about 1 µm. This enables adequate number of local electrical connections inside the building blocks.

Electrical connectors 38 are formed at the top surface of package component 20. In accordance with some embodiments of the present disclosure, electrical connectors 38 include metal pillars (bumps), wherein solder caps may be, or may not be, formed on the top surfaces of the metal pillars. In accordance with alternative embodiments of the present disclosure, electrical connectors 38 include solder regions. In accordance with yet other embodiments, electrical connectors 38 include copper pillars covered with nickel layers, Electro-less Nickel Immersion Gold (ENIG), Electro-less Nickel Electro-less Palladium Immersion Gold (EN-EPIG), and/or the like, and/or a combination thereof.

Figure 2:
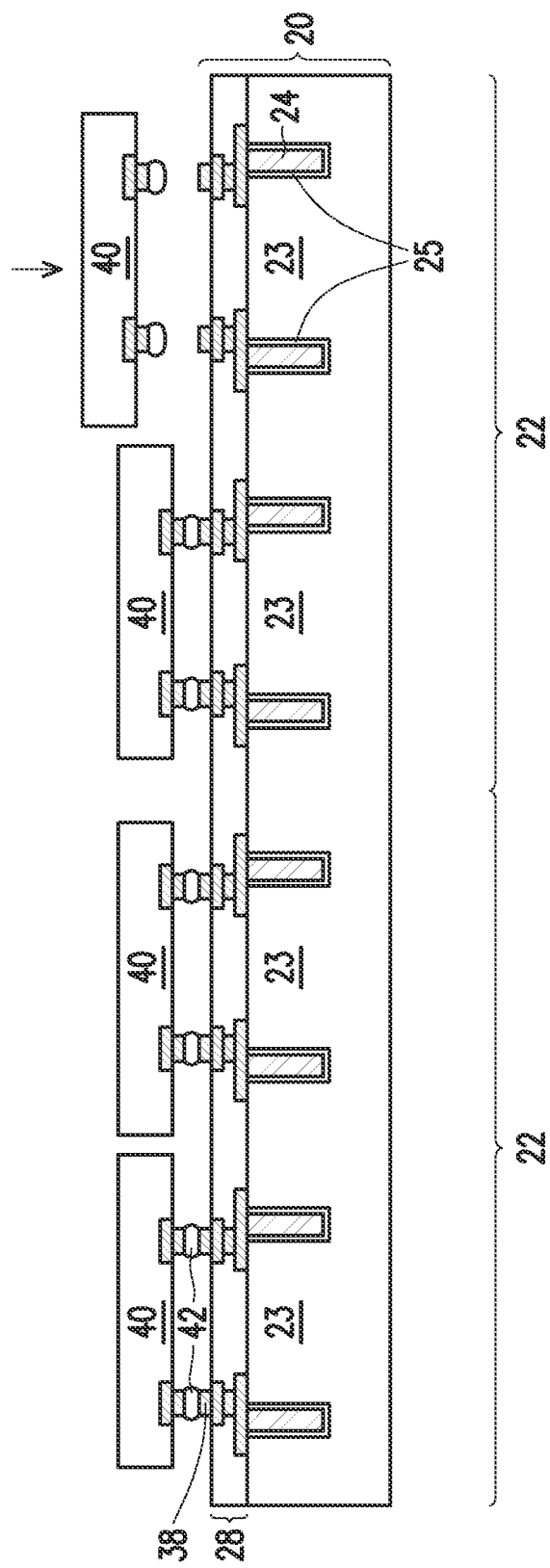
Figure 30:
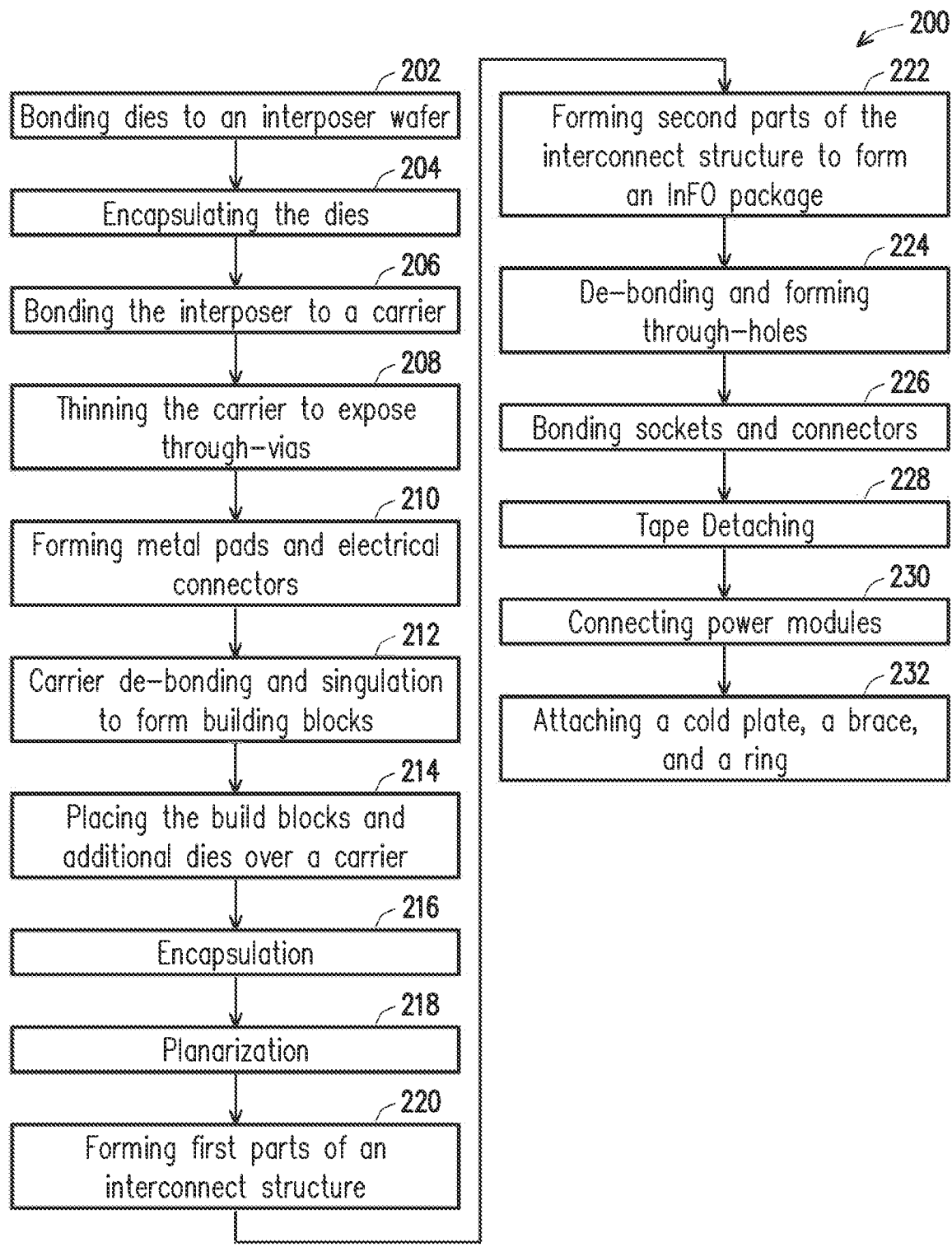
FIG. 30 illustrates a process flow for forming a system package in accordance with some embodiments.

Referring to FIG. 2, package components 40 are pick-and-placed, and are bonded to package component 20, for example, through flip-chip bonding. The respective process is illustrated as process 202 in the process flow 200 as shown in FIG. 30. Electrical connectors 38 electrically couple the circuits in package components 40 to metal lines 32 and through-vias 24 in package component 20. In accordance with some embodiments, package components 40 include device dies, which may include logic dies, memory dies, Input-output (IO) dies, or the like. The device dies may include Central Processing Unit (CPU) dies, Graphic Processing Unit (GPU) dies, Application Specific Integrated Circuit (ASIC) dies, Field-Programmable Gate Array (FPGA) dies, mobile application dies, Serializer/Deserializer (SerDes) dies, Peripheral Component Interconnect Express (PCiE) dies, Serial Advanced Technology Attachment (SATA) dies, Micro Control Unit (MCU) dies, Application processor (AP) dies, or the like. The memory dies may include Dynamic Random Access Memory (DRAM) dies, Static Random Access Memory (SRAM) dies, or the like. Package components 40 may also include System on Chip (SoC) dies, memory stacks (such as High-Bandwidth Memory (HBM) cubes), or the like. Package components 40 may also include Independent Passive Device (IPD) dies, which are discrete device dies that include passive device(s) therein, and are free from active devices therein. For example, the IPD dies may be capacitor dies, resistor dies, inductor dies, or the like. The capacitor dies may be Multiplayer Ceramic Chip Capacitors (MLCCs) as an example. A reflow is performed to reflow solder regions 42, so that package components 40 are bonded to interposers 22. On each of interposers 22, there may be a plurality of package components 40 bonded thereon. For example, as shown in FIGS. 8 through 15, package components 40 bonded to the same package component 20 may include a plurality of different types of dies 40A, 40B, and 40C, as described referring to FIGS. 8 through 15 as examples.

Figure 3:
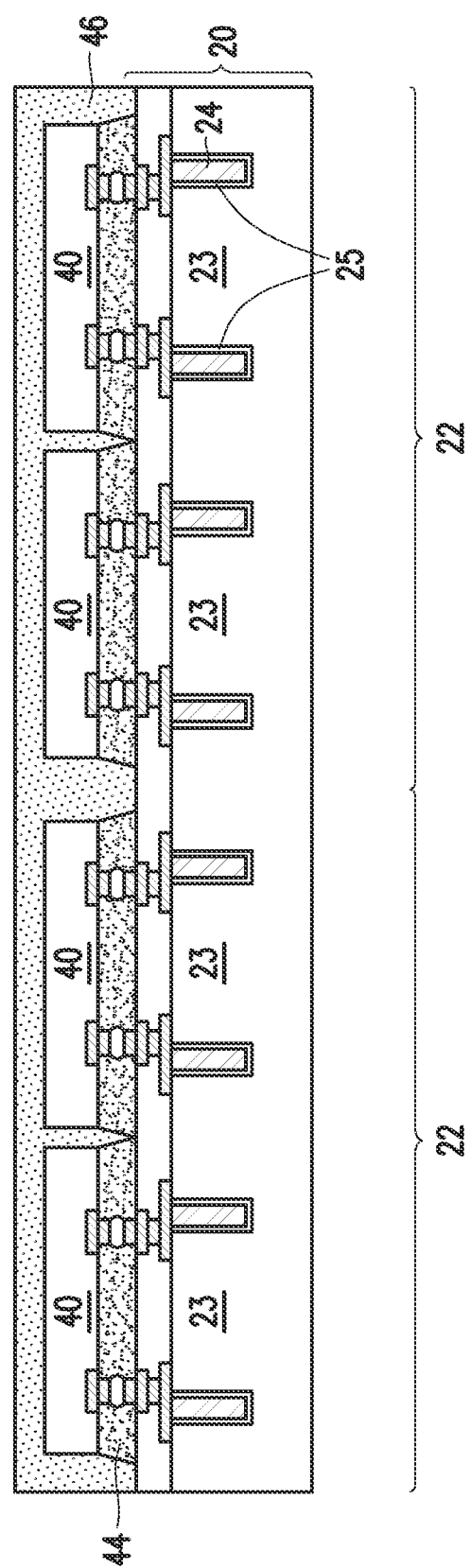

Next, referring to FIG. 3, the gaps between package components 40 and package component 20 are filled with underfill 44. Underfill 44 may include a polymer or an epoxy, and may include filler particles therein. The respective process is illustrated as process 204 in the process flow 200 as shown in FIG. 30. Encapsulant 46 is encapsulated on package components 40, for example, using expose molding. In accordance with some embodiments of the present disclosure, encapsulant 46 includes a molding compound, which includes a base material and fillers mixed in the base material. The base material may include a polymer, a resin, an epoxy, and/or the like. The fillers may be formed of spherical particles of silica, aluminum oxide, silicon oxide, or the like. A curing process is performed to cure and solidify encapsulant 46. In accordance with some embodiments, package components 40 are buried in encapsulant 46.

Figure 4:
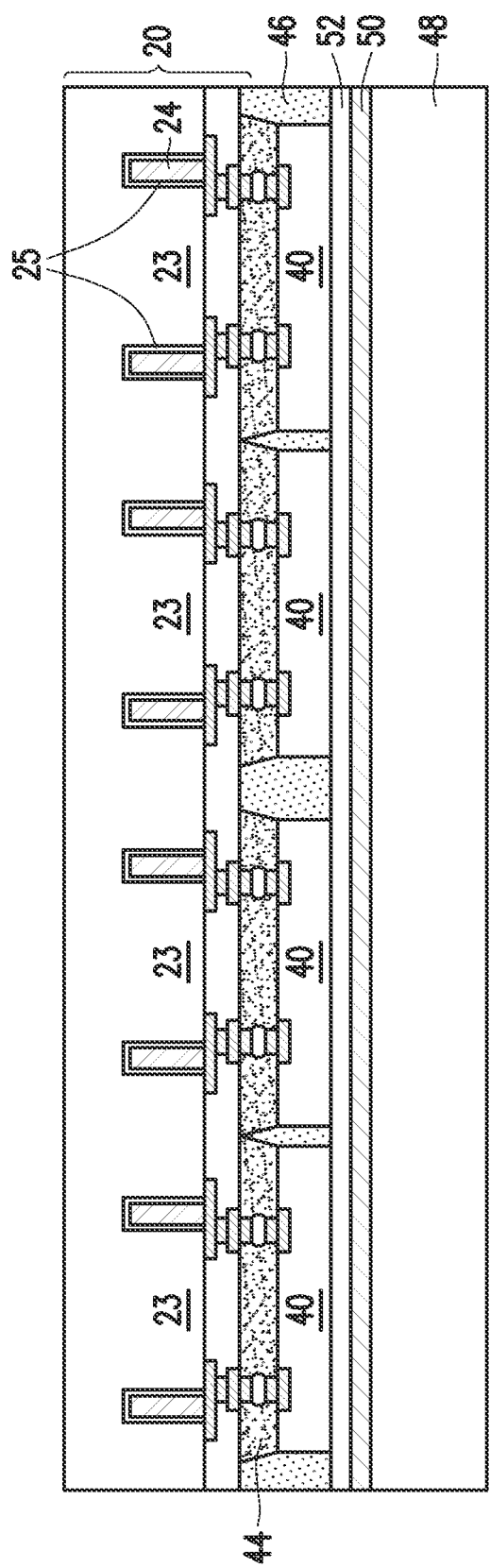

After the curing of encapsulant 46, a planarization process such as a Chemical Mechanical Polish (CMP) process or a mechanical grinding process may be performed to remove excess portions of encapsulant 46, which excess portions are over the top surfaces of package components 40. The polished structure is shown in FIG. 4. In accordance with some embodiments of the present disclosure, the substrates (such as silicon substrates) of some or all of package components 40 are exposed as a result of the planarization process.

Figure 5:
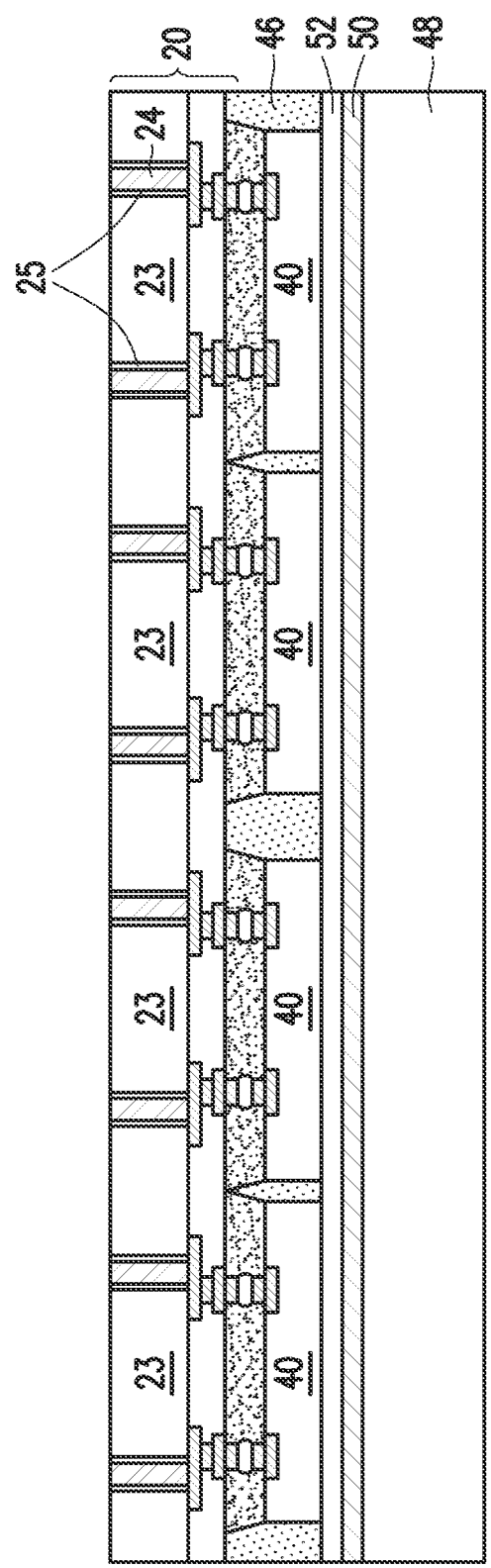
Figure 6:
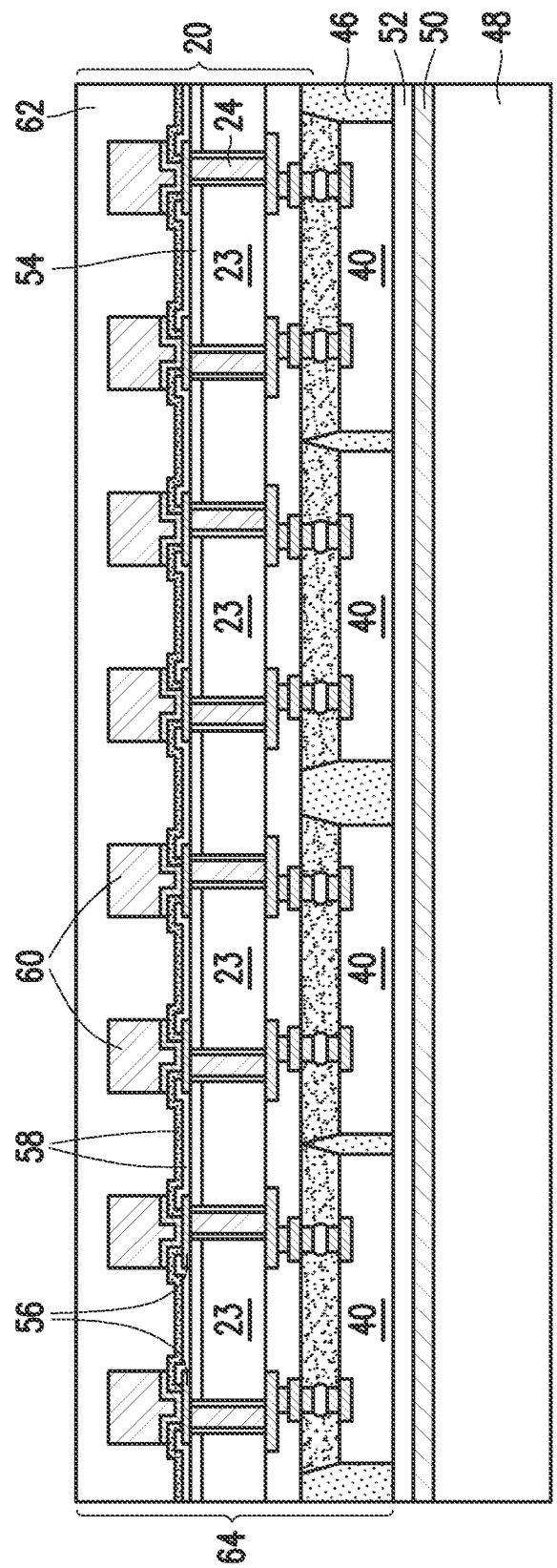

FIGS. 4 through 6 illustrate the formation of the backside structure on the backside of package component 20. Referring to FIG. 4, carrier 48 is provided, and release film 50 is coated on carrier 48. Carrier 48 is formed of a transparent material, and may be a glass carrier, a ceramic carrier, an organic carrier, or the like. Release film 50 is in physical contact with the top surface of carrier 48. Release film 50 may be formed of a Light-To-Heat-Conversion (LTHC) coating material. Release film 50 may be applied onto carrier 48 through coating. In accordance with some embodiments of the present disclosure, the LTHC coating material is capable of being decomposed under the heat of light/radiation (such as a laser beam), and can release carrier 48 from the structure placed and formed thereon.

In accordance with some embodiments, the structure as shown in FIG. 3 is attached/bonded to release film 50, for example, through Die-Attach Film (DAF) 52, which is an adhesive film. The respective process is illustrated as process 206 in the process flow 200 as shown in FIG. 30. Some or all of package components 40 may be in contact with DAF 52, and the back surface of substrate 23 is exposed.

Next, as shown in FIG. 5, a backside grinding process is performed to thin substrate 23, until through-vias 24 are exposed. The respective process is illustrated as process 208 in the process flow 200 as shown in FIG. 30. Substrate 23 may then be etched slightly, so that the top portions of through-vias 24 protrude out of the remaining substrate 23. In subsequent processes, as shown in FIG. 6, dielectric layer 54 is formed on the backside of semiconductor substrate 23. The formation of dielectric layer 54 may include depositing a dielectric material such as silicon oxide, and performing a planarization process to remove the portions of the dielectric material higher than the top surfaces of through-vias 24. The remaining portion of the dielectric material is dielectric layer 54.

In subsequent processes, metal pads 56 and dielectric layers 58 may be formed. The respective process is illustrated as process 210 in the process flow 200 as shown in FIG. 30. Metal pads 56 may be formed of aluminum, aluminum copper, or the like. In accordance with some embodiments of the present disclosure, dielectric layer(s) 58 are formed to cover the edge portions of metal pads 56, while leaving the center portions of metal pads 56 exposed. Dielectric layer(s) 58 may be formed of inorganic and/or organic materials such as silicon oxide, silicon nitride, polyimide, polybenzoxazole (PB 0), or the like.

Electrical connectors 60 are formed to electrically connect to through-vias 24. The respective process is also illustrated as process 210 in the process flow 200 as shown in FIG. 30. In accordance with some embodiments, electrical connectors 60 are metal pillars, which are formed through plating. In accordance with other embodiments, electrical connectors 60 are solder regions. Protection layer 62 may be formed to cover electrical connectors 60. In accordance with some embodiments, protection layer 62 is formed of a polymer such as polyimide, PBO, or the like. Throughout the description, the structure over DAF 52 is referred to as reconstructed wafer 64.

Reconstructed wafer 64 is then de-bonded from carrier 48, for example, by projecting light on release film 50, and the light (such as a laser beam) penetrates through the transparent carrier 48. The respective process is illustrated as process 212 in the process flow 200 as shown in FIG. 30. The release film 50 is thus decomposed, and reconstructed wafer 64 is released from carrier 48. DAF 52 may be removed in a cleaning process.

Figure 7:
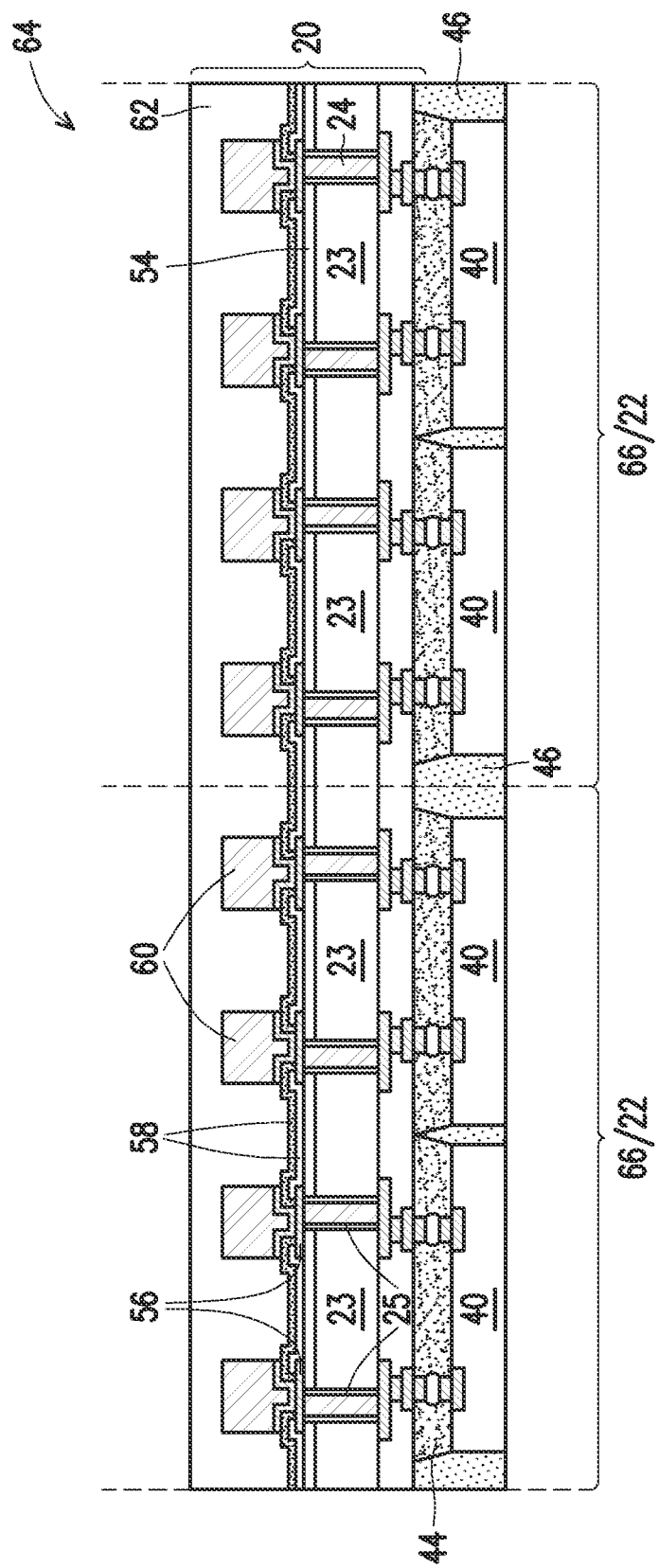

Next, a singulation (dicing) process is performed on reconstructed wafer 64 to saw the reconstructed wafer 64 into a plurality of building blocks 66, which are shown in FIG. 7. The respective process is also illustrated as process 212 in the process flow 200 as shown in FIG. 30. Each of the building blocks 66 includes one of the interposers 22 (FIG. 1) and the corresponding package components 40 bonded thereon. In accordance with some embodiment, building blocks 66 are large packages, which may have sizes ranging from about 2,500 mm² to about 14,400 mm².

It is appreciated that FIGS. 1 through 7 illustrate the formation of some example building blocks 66, which are formed based on interposers, on which device dies are bonded. In accordance with other embodiments of the present disclosure, building blocks 66 may be Chip-on-Wafer-on-Substrate (CoWoS) packages, Integrated Fan-out (InFO) packages, or other types of 3DIC structures.

Figure 9:
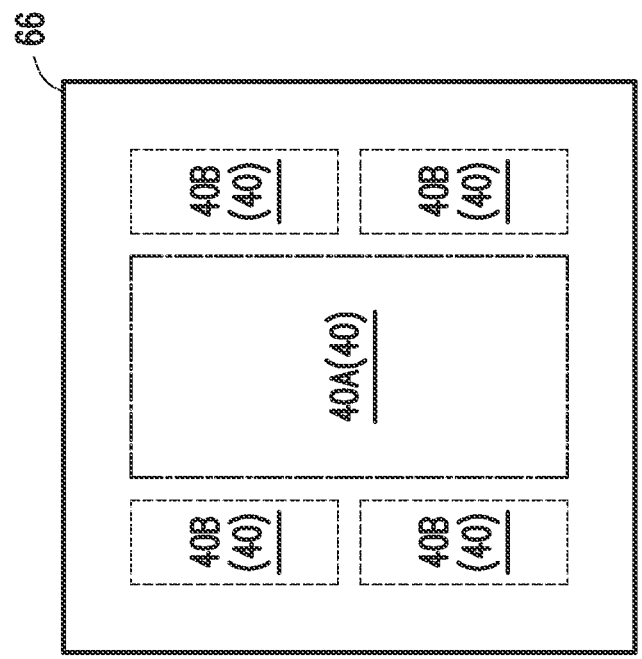
FIGS. 8 through 15 illustrate the layouts of the components in building blocks in accordance with some embodiments.
Figure 8:
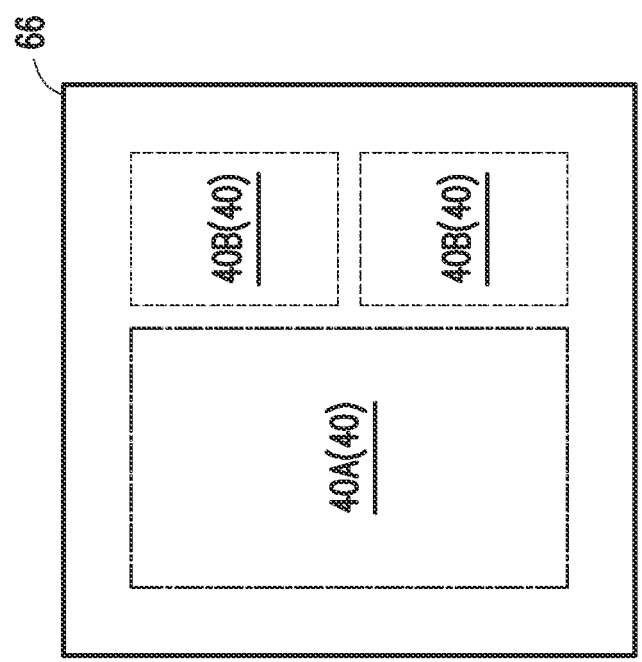

FIGS. 8 through 15 illustrate the example layouts of building blocks 66 in accordance with some embodiments of the present disclosure. FIG. 8 illustrates building block 66 in accordance with some embodiments, in which building block 66 includes logic die 40A and one or more memory or IO (referred to as memory/IO hereinafter) die 40B located aside of logic die 40A. Throughout the description, logic die 40A, memory/IO dies 40B, and IPD dies 40C are collectively referred to as device dies 40 or package components 40. The memory/IO die 40B may be placed on one side of logic die 40A. FIG. 9 illustrates building block 66 in accordance with alternative embodiments of the present disclosure, in which building block 66 includes logic die 40A and memory/IO dies 40B placed on the opposite sides of logic die 40A.

Figure 11:
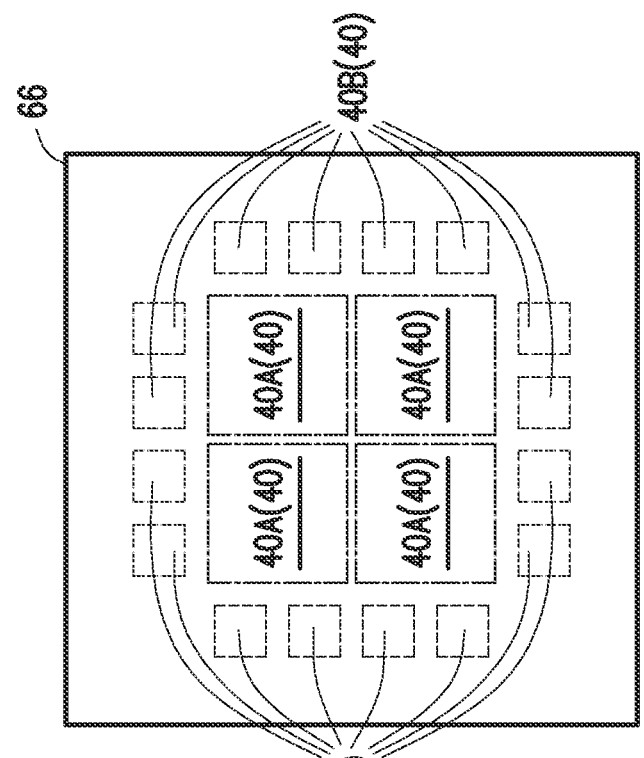
Figure 10:
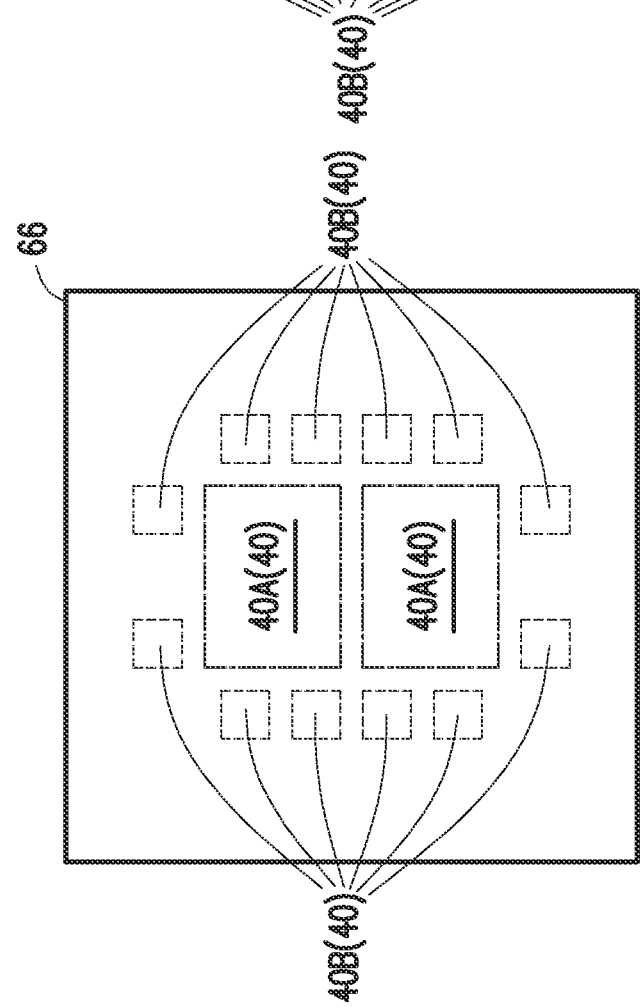

FIG. 10 illustrates building block 66 in accordance with some embodiments, in which building block 66 includes two or more logic dies 40A, and memory/IO dies 40B aligned to a ring encircling logic dies 40A. Memory/IO die 40B may be arranged along the peripheral of building block 66. FIG. 11 illustrates building block 66 in accordance with some embodiments, in which building block 66 includes four logic dies 40A, with each of logic dies 40A accompanied by, and electrically and signally connected to, the serving memory/IO dies 40B. Memory/IO dies 40B are also aligned to a ring encircling logic dies 40A, which may form an array.

Figure 13:
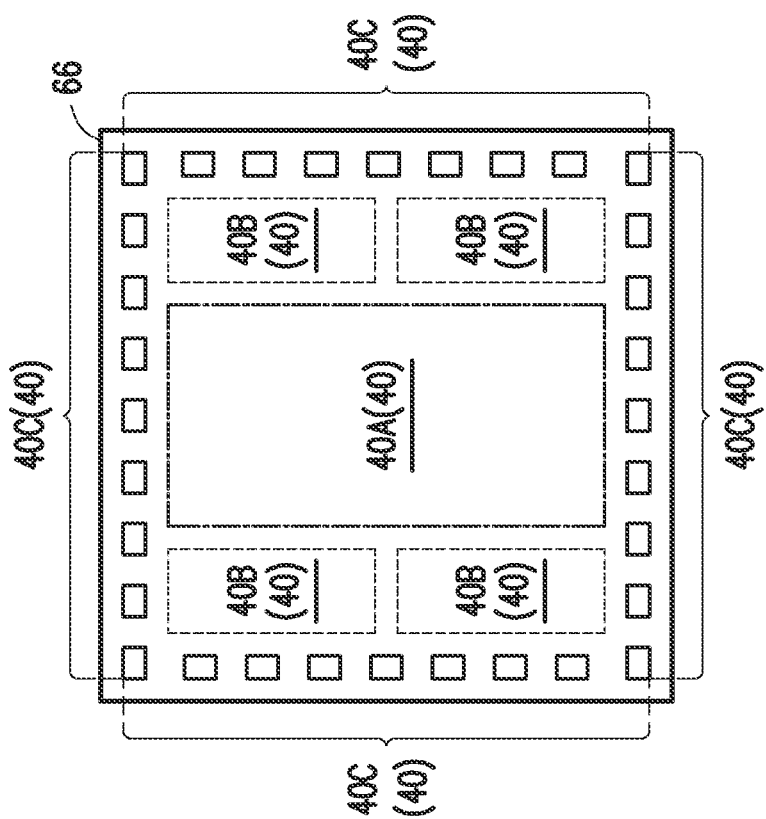
Figure 12:
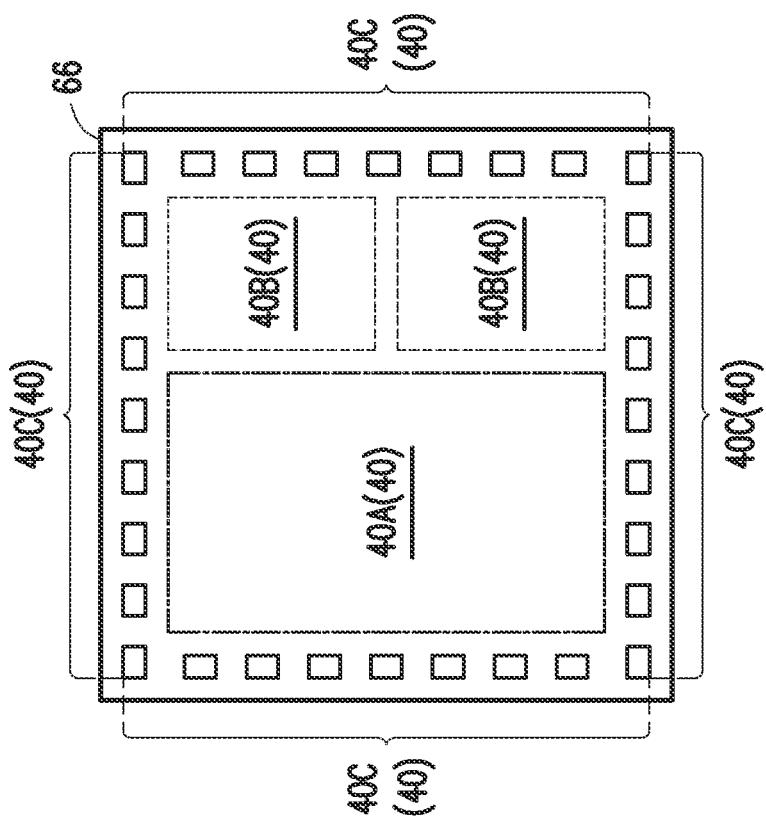

FIG. 12 illustrates building block 66 in accordance with some embodiments, in which building block 66 includes logic die 40A and one or more memory/IO die 40B on a side of logic die 40A. A plurality of IPD dies 40C are aligned to a ring encircling logic die(s) 40A and memory/IO die(s) 40B. IPD dies 40C may be arranged along the peripheral of building block 66. FIG. 13 shows a structure similar to the structure in FIG. 12, except that memory/IO dies 40B are on opposite sides of logic ide 40A.

Figure 15:
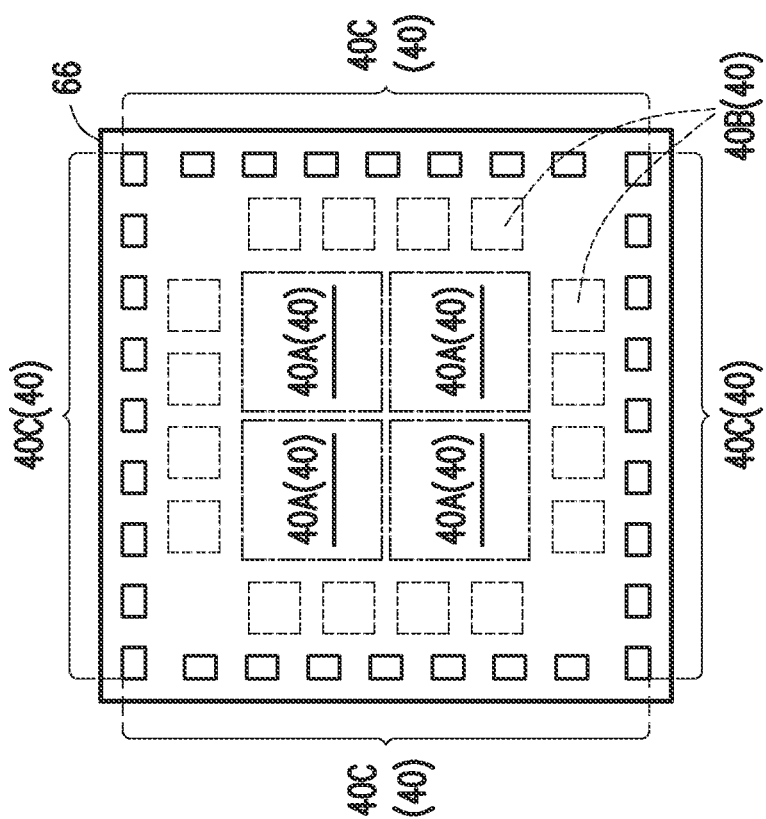
Figure 14:
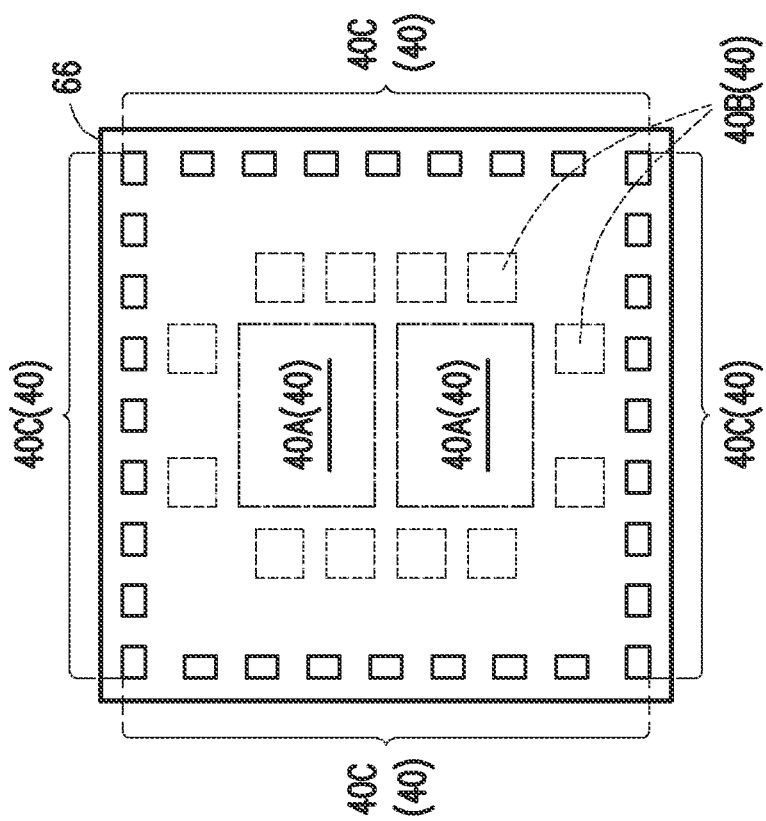

FIG. 14 illustrates building block 66 in accordance with some embodiments, in which building block 66 includes two or more logic dies 40A, and memory/IO dies 40B aligned to a ring encircling logic dies 40A. IPD dies 40C are further aligned to a ring along the peripheral of building block 66, and encircling memory/IO die 40B. FIG. 15 illustrates building block 66 in accordance with some embodiments, in which building block 66 includes a plurality of logic dies 40A forming an array, with each of logic dies 40A accompanied by, and electrically and signally connected to, serving memory/IO dies 40B. IPD dies 40C are further aligned to a ring along the peripheral of building block 66, and encircling memory/IO dies 40B.

Figure 16:
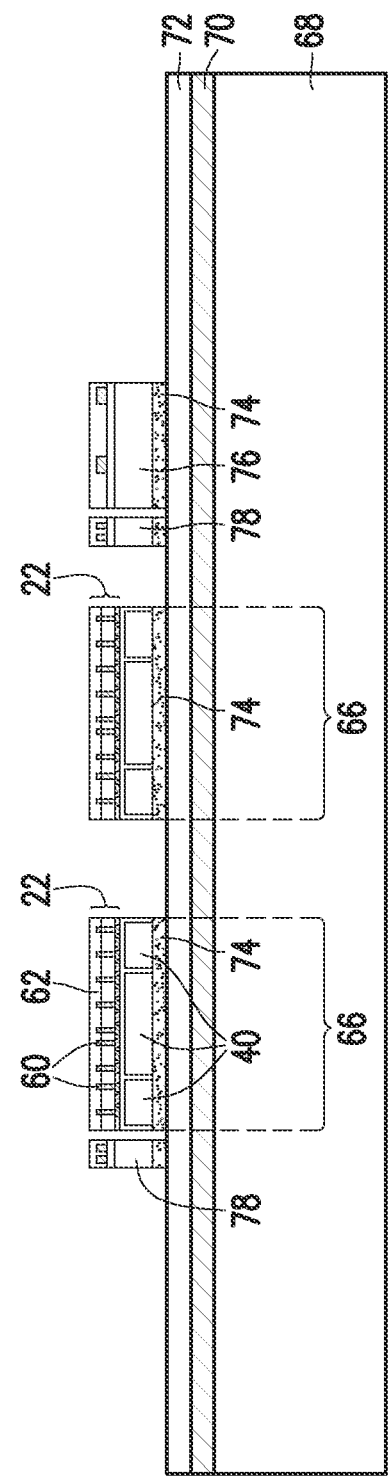
FIGS. 16 through 24 illustrate the cross-sectional views of intermediate stages in the formation of a system package including building blocks and bare device dies in accordance with some embodiments.

FIGS. 16 through 24 illustrate the intermediate stages in the formation of a system package in accordance with some embodiments of the present disclosure. Referring to FIG. 16, carrier 68 is provided, and release film 70 is coated on carrier 68. In accordance with some embodiments, dielectric buffer layer 72 is formed on release film 70. In accordance with alternative embodiments, dielectric buffer layer 72 is omitted. The materials of carrier 68, release film 70, and dielectric buffer layer 72 may be selected from the same group of candidate materials for forming carrier 48, release film 50, and DAF 52, respectively, as shown in FIG. 4, and are not repeated herein.

FIG. 16 further illustrates the placement/attachment of building blocks 66, bare dies 76, and IPD dies 78. The respective process is illustrated as process 214 in the process flow 200 as shown in FIG. 30. Bare dies may be device dies that are sawed from the respective wafers, and are not further packaged. In accordance with some embodiments, bare dies include logic dies, memory dies, SoC dies, or the like. Building blocks 66, bare dies 76, and IPD dies 78 are attached to dielectric buffer layer 72 through DAFs 74. In accordance with some embodiments of the present disclosure, DAFs 74 are in physical contact with the semiconductor substrates of some or all of building blocks 66, bare dies 76, and IPD dies 78. There may be a plurality of groups of building blocks 66, bare dies 76, and IPD dies 78 placed on dielectric buffer layer 72. Building blocks 66 may be identical to each other, or may be different from each other. For example, the numbers of dies 40 in different ones of building blocks 66 may be the same as each other or different from each other. The types of dies 40 in different ones of building blocks 66 may also be the same as each other or different from each other.

Figure 17:
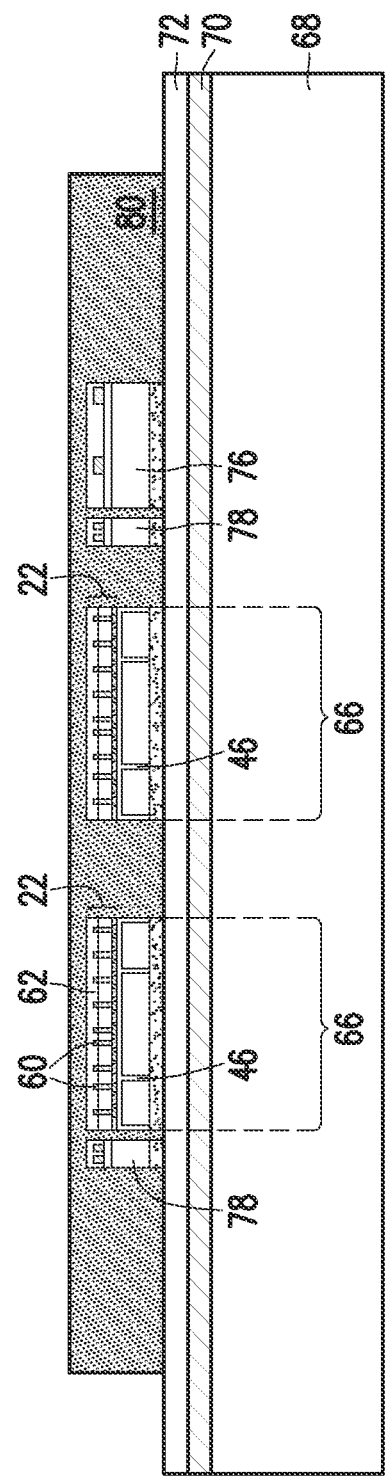

Next, encapsulant 80 is dispensed to encapsulate building blocks 66, bare dies 76, and IPD dies 78, as shown in FIG. 17. Encapsulant 80 is then cured. The respective process is illustrated as process 216 in the process flow 200 as shown in FIG. 30. Encapsulant 80 fills the gaps between building blocks 66, bare dies 76, and IPD dies 78. Encapsulant 80 may include a molding compound, a molding underfill, an epoxy, and/or a resin. Since encapsulant 46 in building blocks have been sawed in the singulation process (FIG. 7), there are distinguishable interfaces between encapsulant 46 and encapsulant 80. For example, the spherical filler particles in encapsulant 46 will become partial particles when sawed, making the interface between encapsulant 46 and encapsulant 80 distinguishable.

Encapsulant 80 is dispensed to a level so that the top surface of encapsulant 80 is higher than the top ends of electrical connectors 60 and protection layer 62 in building blocks 66. When formed of molding compound or molding underfill, encapsulant 80 may include a base material, which may be a polymer, a resin, an epoxy, or the like, and filler particles (not shown) in the base material. The filler particles may be dielectric particles of $SiO_2$, $Al_2O_3$, silica, or the like, which may have spherical shapes. Also, the spherical filler particles may have the same or different diameters.

Figure 18:
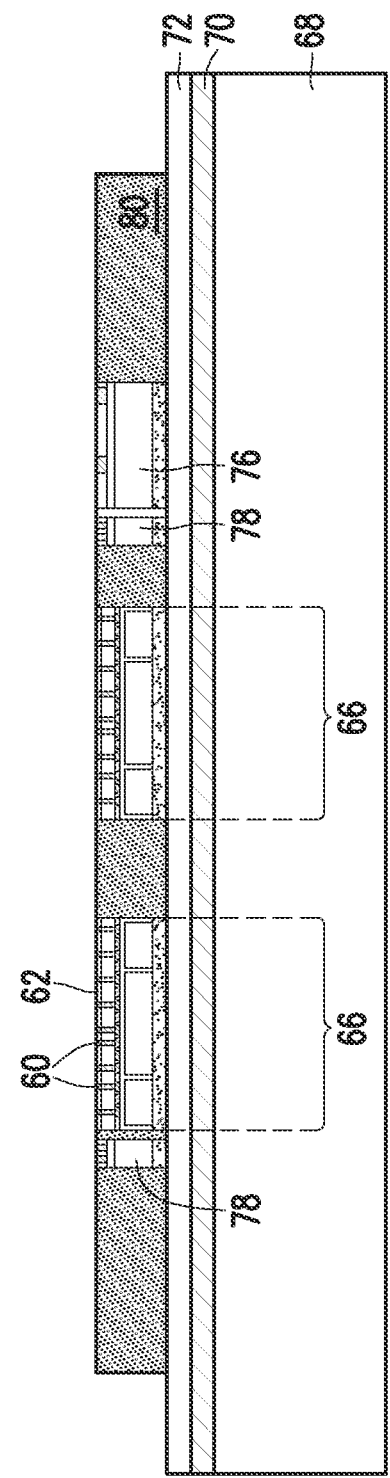

Subsequent to the dispensing of encapsulant 80, as also shown in FIG. 18, a planarization process such as a CMP process or a mechanical grinding process is performed to planarize encapsulant 80, protection layer 62, and electrical connectors 60 of building blocks 66. As a result, the electrical connectors of bare dies 76 and IPD dies 78 are all exposed. The respective process is illustrated as process 218 in the process flow 200 as shown in FIG. 30.

Figure 19:
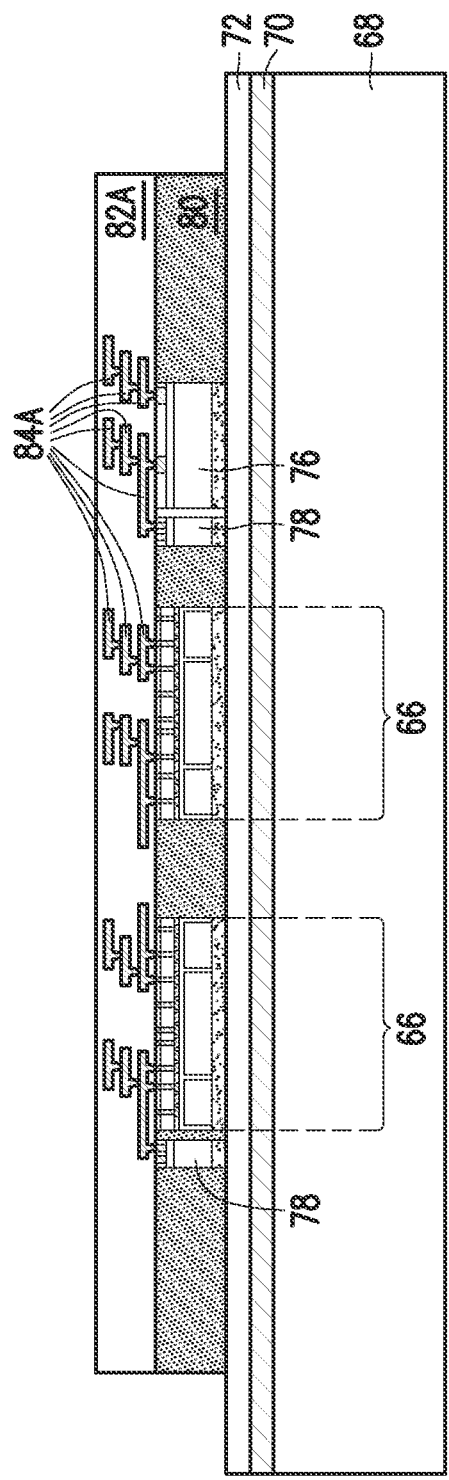
Figure 20:
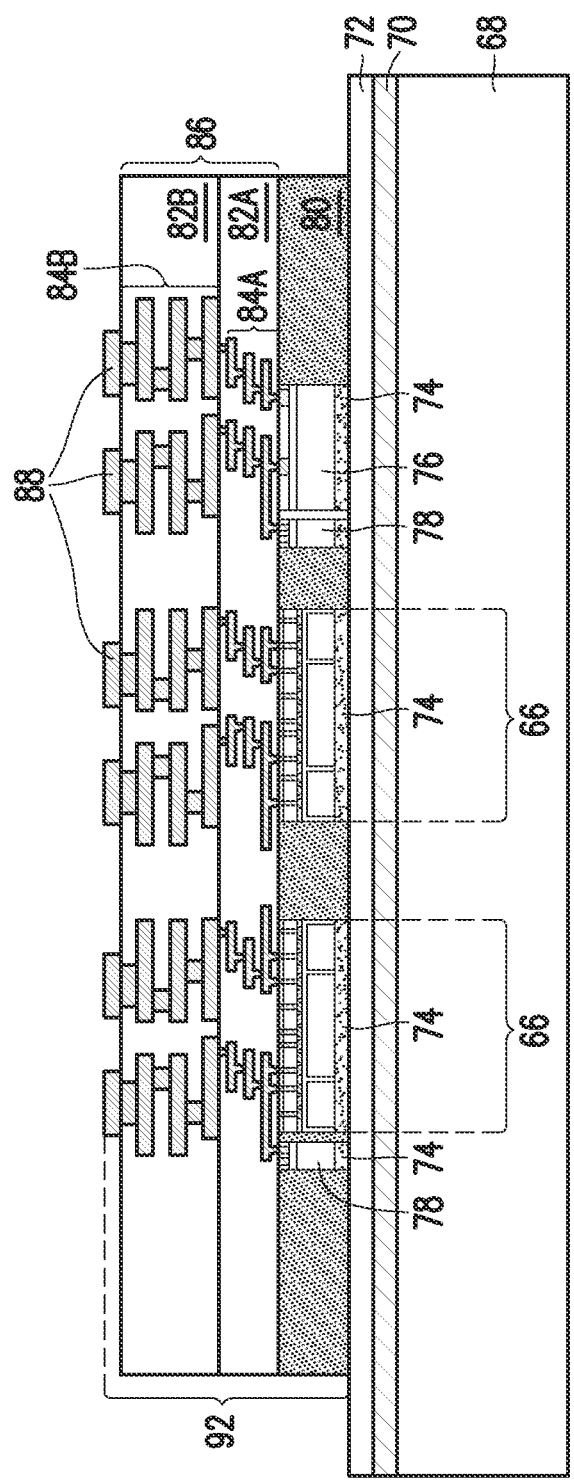

In subsequent processes, interconnect structure 86 is formed over encapsulant 80. FIGS. 19 and 20 illustrate the formation of the first parts and the second parts, respectively, of the interconnect structure 86. The respective processes are illustrated as processes 220 and 222, respectively, in the process flow 200 as shown in FIG. 30. In accordance with some embodiments of the present disclosure, interconnect structure 86 includes dielectric layers 82A and dielectric layers 82B over dielectric layer 82A. Each of the dielectric layers 82B may be thicker than any of the dielectric layers 82A. In accordance with some embodiments of the present disclosure, dielectric layers 82A are formed of a photo-sensitive material(s) such as PBO, polyimide, BCB, or the like, and dielectric layers 82B are formed of a non-photosensitive material such as molding compound, molding underfill, silicon oxide, silicon nitride, or the like. In accordance with alternative embodiments, both of dielectric layers 82A and 82B are formed of photo-sensitive material(s).

RDLs 84A are formed in dielectric layers 82A, and RDLs 84B are formed in dielectric layers 82B. In accordance with some embodiments, RDLs 84B are thicker and/or wider than RDLs 84A, and may be used for long-range electrical routing, while RDLs 84A may be used for short-range electrical routing. Electrical connectors 88 are formed on the surface of interconnect structure 86. Electrical connectors 88 and RDLs 84A and 84B are electrically connected to building blocks 66, bare dies 76, and IPD dies 78. Furthermore, RDLs 84A and 84B provide lateral interconnection between building blocks 66. Throughout the description, the structure over dielectric buffer layer 72 (or release film 70 if dielectric buffer layer 72 is not formed) is referred to as InFO package 92, which is also a reconstructed wafer.

Figure 21:
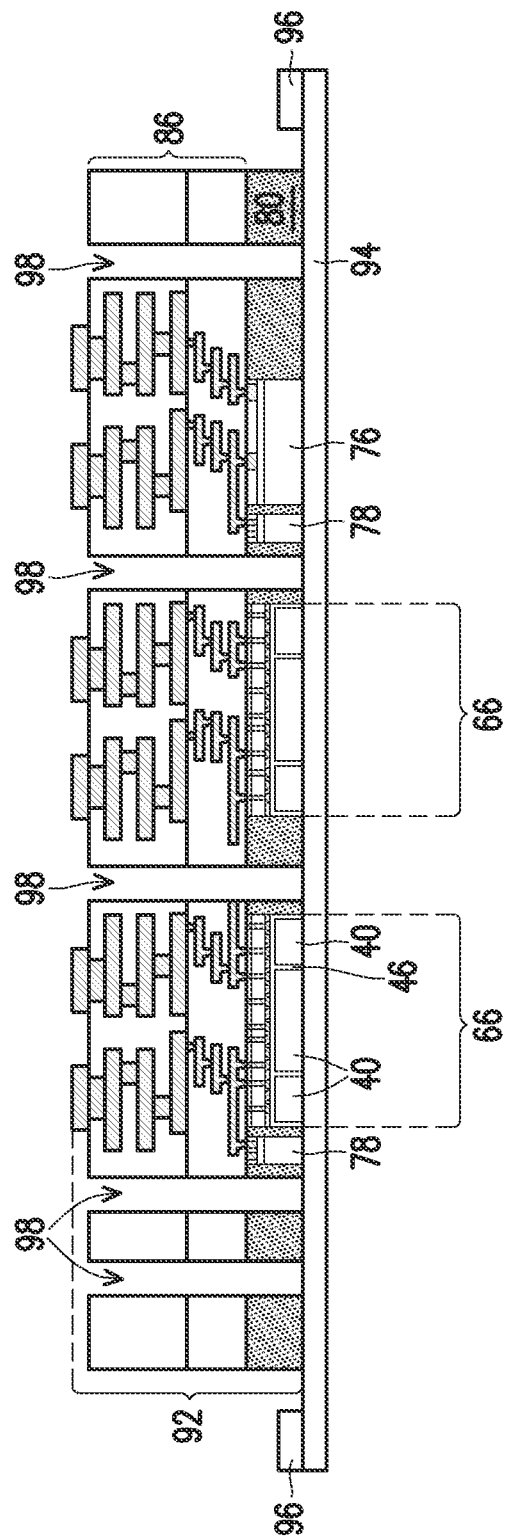

In a subsequent process, carrier 68 is de-bonded from InFO package 92. In accordance with some embodiments of the present disclosure, DAFs 74 are removed, for example, in a cleaning process or a grinding process. The respective process is illustrated as process 224 in the process flow 200 as shown in FIG. 30. The resulting InFO package 92 is shown in FIG. 21. Through-holes 98 may be formed to penetrate through InFO package 92. The respective process is also illustrated as process 224 in the process flow 200 as shown in FIG. 30. Through-holes 98 may be formed through laser drill, drilling using a drill bit, or the like. In accordance with some embodiments, building blocks 66 are distributed as an array including a plurality of rows and a plurality of columns, as shown in FIGS. 25 through 29. A plurality of horizontal spacings and a plurality of vertical spacings separate the row and the columns, respectively, from each other. Through-holes 98 may be located at the overlapping areas of the horizontal spacings and the vertical spacings. InFO package 92 is then attached to tape 94, which is further attached to frame 96, as shown in FIG. 21.

Figure 22:
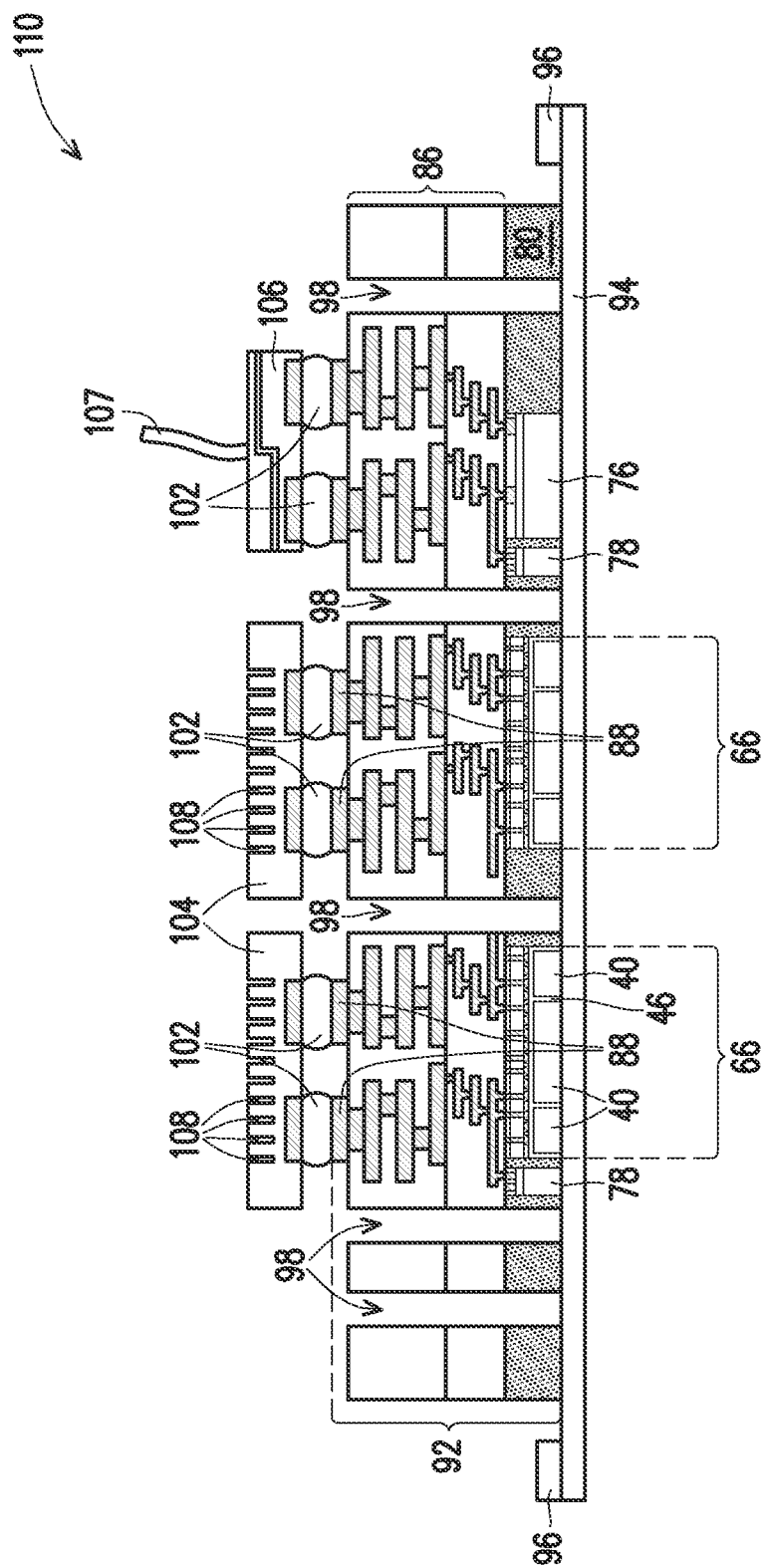

FIG. 22 illustrates the bonding of sockets 104 and connector(s) 106 to InFO package 92, for example, through solder regions 102. The respective process is illustrated as process 226 in the process flow 200 shown in FIG. 30. In accordance with some embodiments, sockets 104 have pin holes 108, and the (female) electrical connectors in pin holes 108 are electrically connected to solder regions 102 and the underlying RDLs, dies, and building blocks. Connectors 106, which are used for the signal connection between the resulting system package 110 (FIG. 24) and other systems, are also bonded to InFO package 92. Connectors 106 may include adaptors, sockets, or the like. Connectors 106 may include a plurality of signal paths, such as a plurality of pins, pin holes, or the like, and may be used as a bus(es) for parallel or serial signal transmissions between system package 110 and other systems. For example, wires 107, which are shown schematically, are connected to connectors 106, and are used to connect system package 110 to other systems. Although not illustrated, an underfill may be dispensed between sockets 104 and InFO package 92, and between connectors 106 and InFO package 92 to protect solder regions 102.

Figure 23:
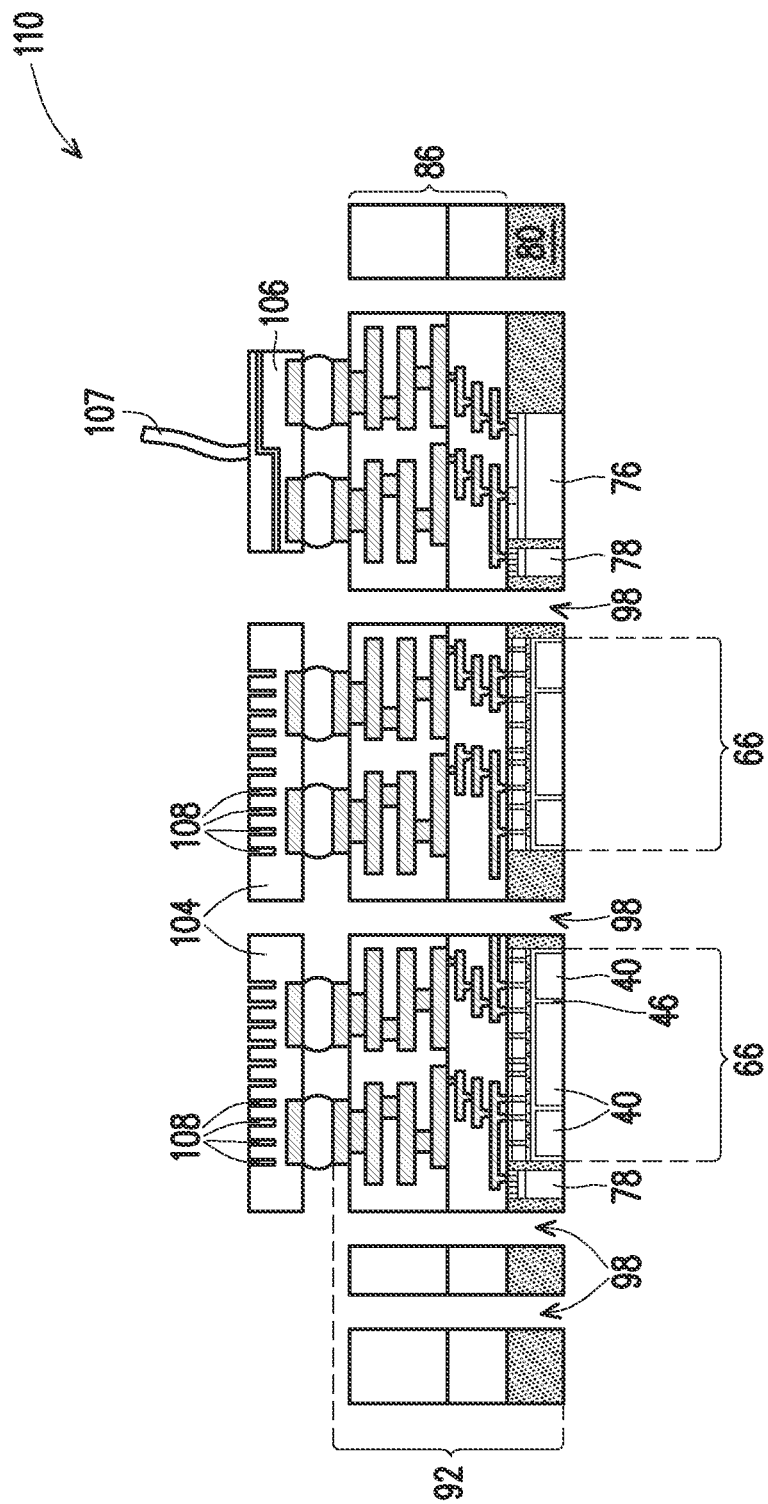

Throughout the description, the components over tape 94 are collectively referred to as system package 110. In a subsequent process, system package 110 is detached from tape 94, and the resulting system package 110 is shown in FIG. 23. The respective process is illustrated as process 228 in the process flow 200 shown in FIG. 30.

Figure 24:
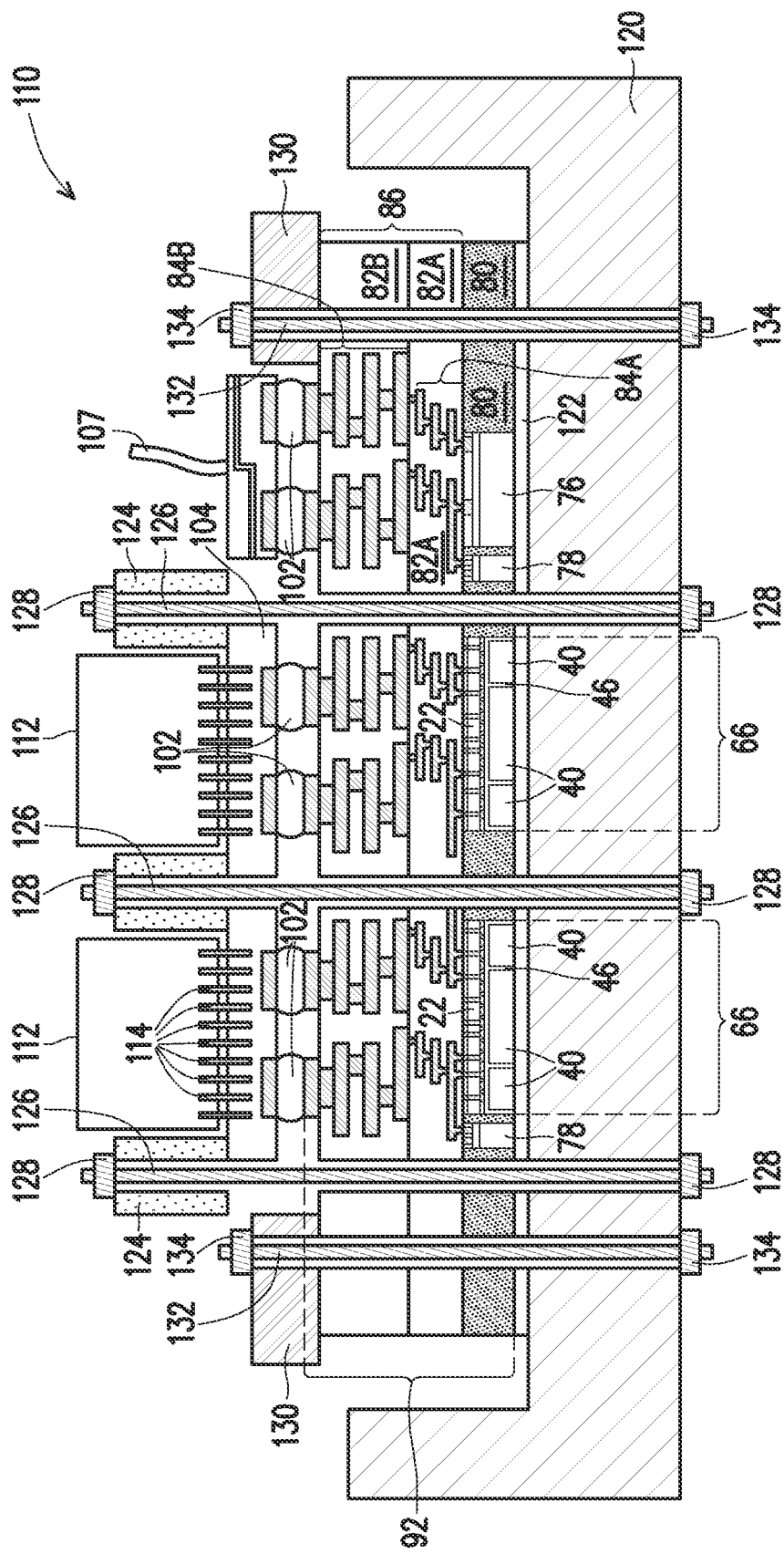

Next, as shown in FIG. 24, power modules 112 are connected to sockets 104 to expand the system package 110. The respective process is illustrated as process 230 in the process flow 200 shown in FIG. 30. For example, power modules 112 include pins 114, which are inserted into the pin holes 108 (FIG. 23) in sockets 104. Power modules 112 may include Pulse Width Modulation (PWM) circuits for regulating power and/or other types of power management circuits. Power modules 112 provide the regulated power to the underlying building blocks 66, bare dies 76, and IPD dies 78. Power modules 112 are also connected to the IPD dies 78 for power management and power storage. Power modules 112 receive power sources (such as AC power source), for example, through connection lines (which connection lines may be over and connected to power modules 112). The power sources and connection lines are not illustrated.

In accordance with some embodiments of the present disclosure, power modules 112 and building blocks 116 may have a one-to-one correspondence, wherein each of power modules 112 corresponds to (and may overlap) one (and only one) building block 116, and each of building blocks 116 corresponds to one (and only one) of power modules 112. In accordance with alternative embodiments of the present disclosure, power modules 112 and building blocks 116 may have an N-to-one correspondence, with a plurality of power modules 112 correspond to, and provide power to, the same building block 66. In accordance with yet alternative embodiments of the present disclosure, power modules 112 and building blocks 116 may have a one-to-N correspondence, with one power module 112 correspond to, and provides power to, a plurality of building blocks 66.

FIG. 24 further illustrates the installation of cold plate (heat dissipating plate) 120, brace 124, and ring 130 to further expand system package 110. The respective process is illustrated as process 232 in the process flow 200 shown in FIG. 30. Cold plate 120 is attached to InFO package 92 through Thermal Interface Material (TIM) 122, which is an adhesive film having good thermal conductivity. Cold plate 120 may be formed of a metallic material such as copper, aluminum, stainless steel, nickel, or the like. Brace 124 is installed through screws 126 and bolts 128. In accordance with some embodiments, the bottom surface of brace 124 is in contact with the top surfaces of sockets 104. Brace 124 may be formed of a metallic material such as copper, stainless steel, or the like. In a top view of system package 110, brace 124 may form a grid (mesh) including a plurality of horizontal strips and a plurality of vertical strips that overlap the spacing between the rows and columns of building blocks 66 (FIGS. 25 through 29), and the horizontal strips and the vertical strips are joined together to form the grid. Brace 124, screws 126 and bolts 128 are in combination used for securing sockets 104 with InFO package 92 and cold plate 120. In addition, metal ring 130, which is a ring pressed on the peripheral regions of InFO package 92, is used to secure InFO package 92 and cold plate 120 together using screws 132 and bolts 134. The resulting system package no is also a system module that can be installed in a larger system.

FIGS. 25 through 29 illustrate the layouts of building blocks 66, bare dies 76, and IPD dies 78 in InFO package 92 in accordance with some embodiments of the present disclosure. It is appreciated that the building blocks 66 in each of the InFO packages 92 may have same structures as each other, or may have different structures and layouts, which may be selected from FIGS. 8 through 15 as examples. In accordance with some embodiments, the InFO packages 92 are super large packages, which may have the size greater than about 10,000 mm². Furthermore, depending on the size of building blocks 66, the size of the InFO packages 92 may be significantly greater than 10,000 mm², for example, in the range between about 50,000 mm², And 100,000 mm², or greater.

Figure 25:
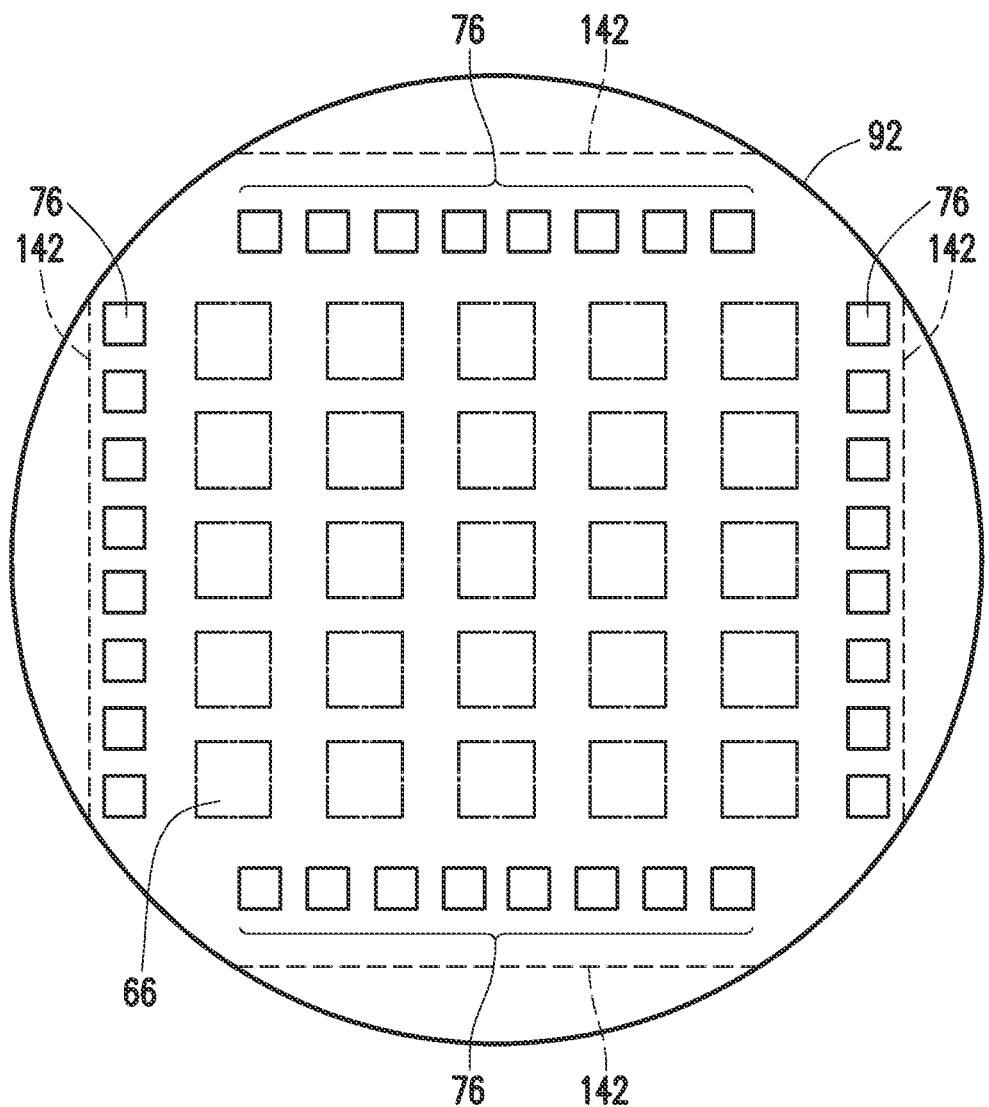
FIGS. 25 through 29 illustrate the layouts of the components in system packages in accordance with some embodiments.
Figure 26:
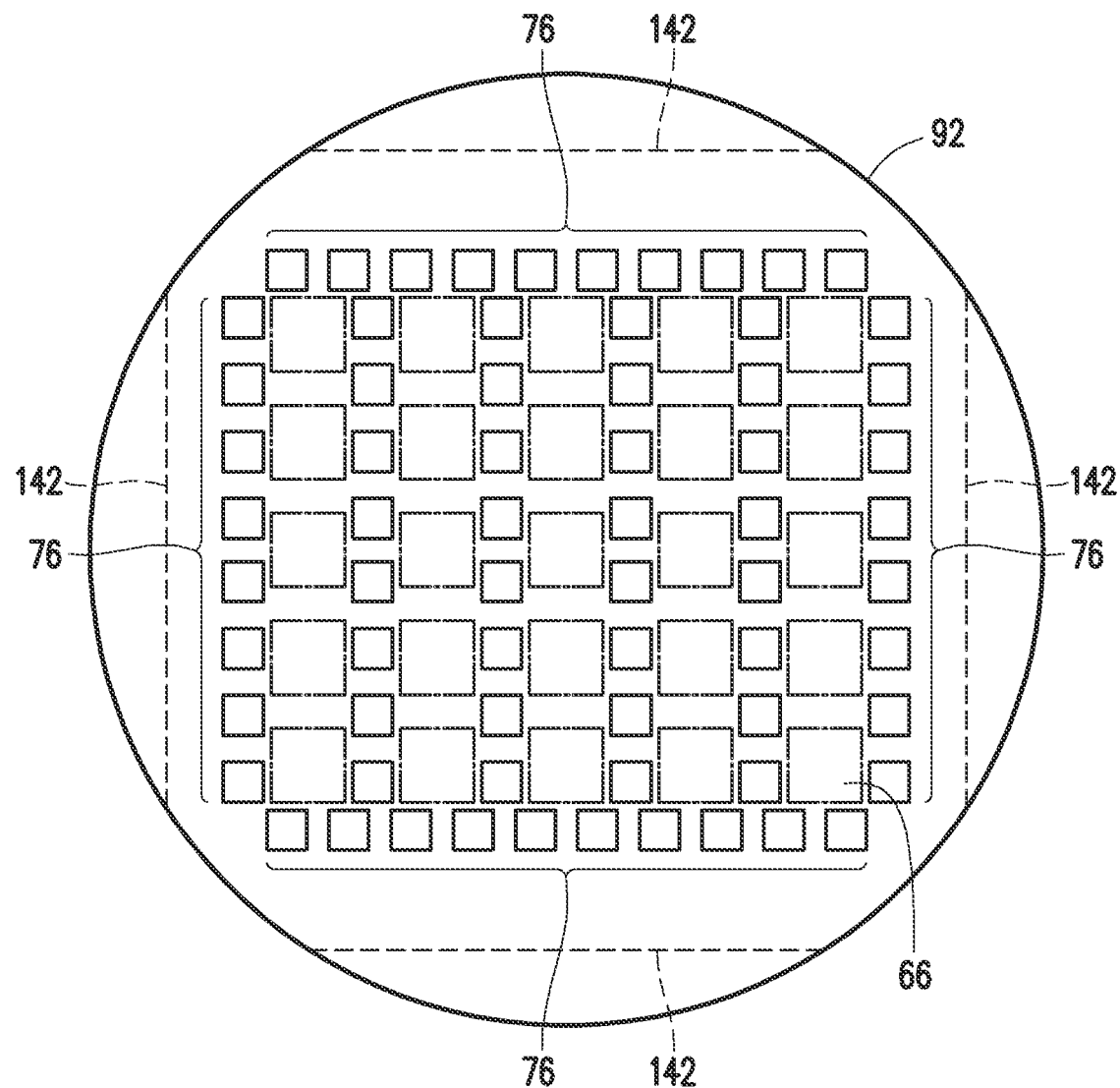
Figure 27:
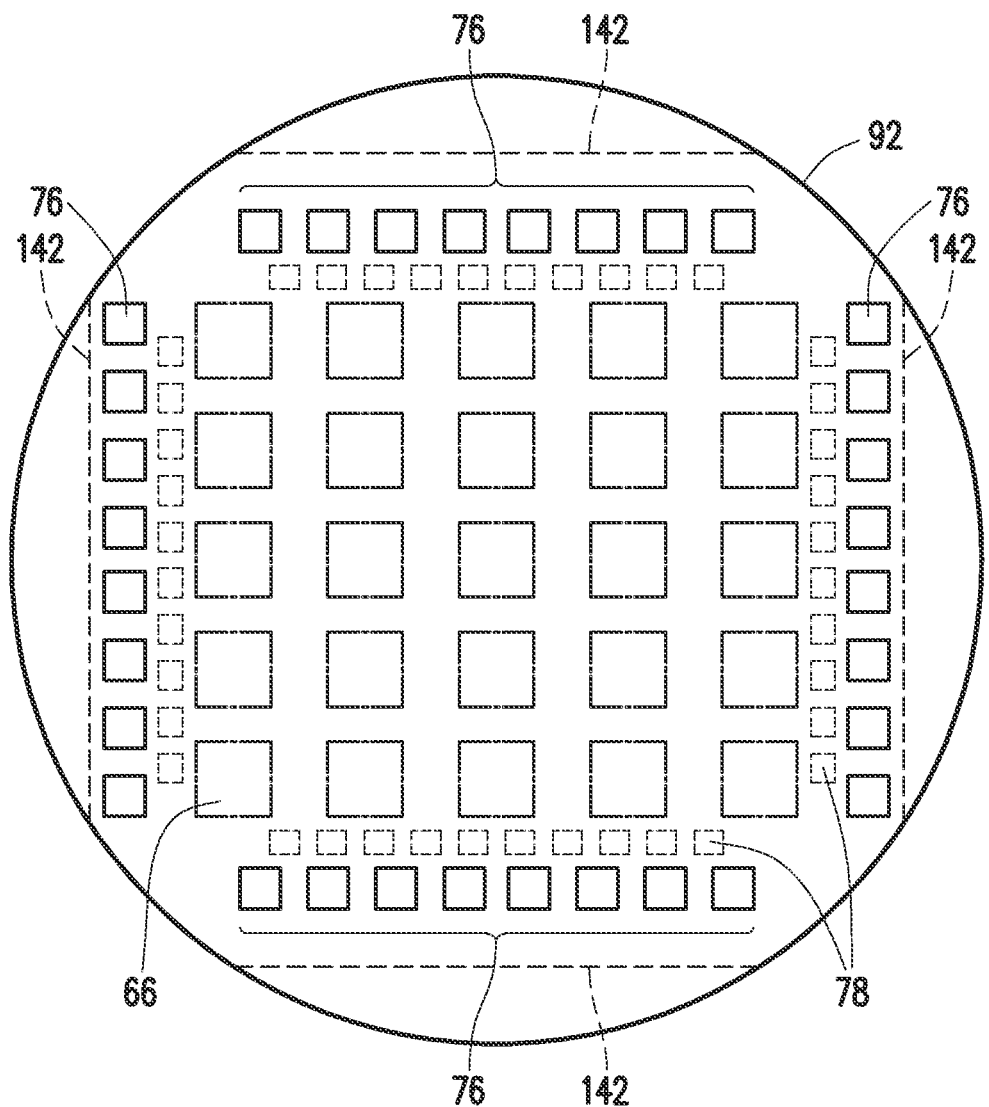
Figure 28:
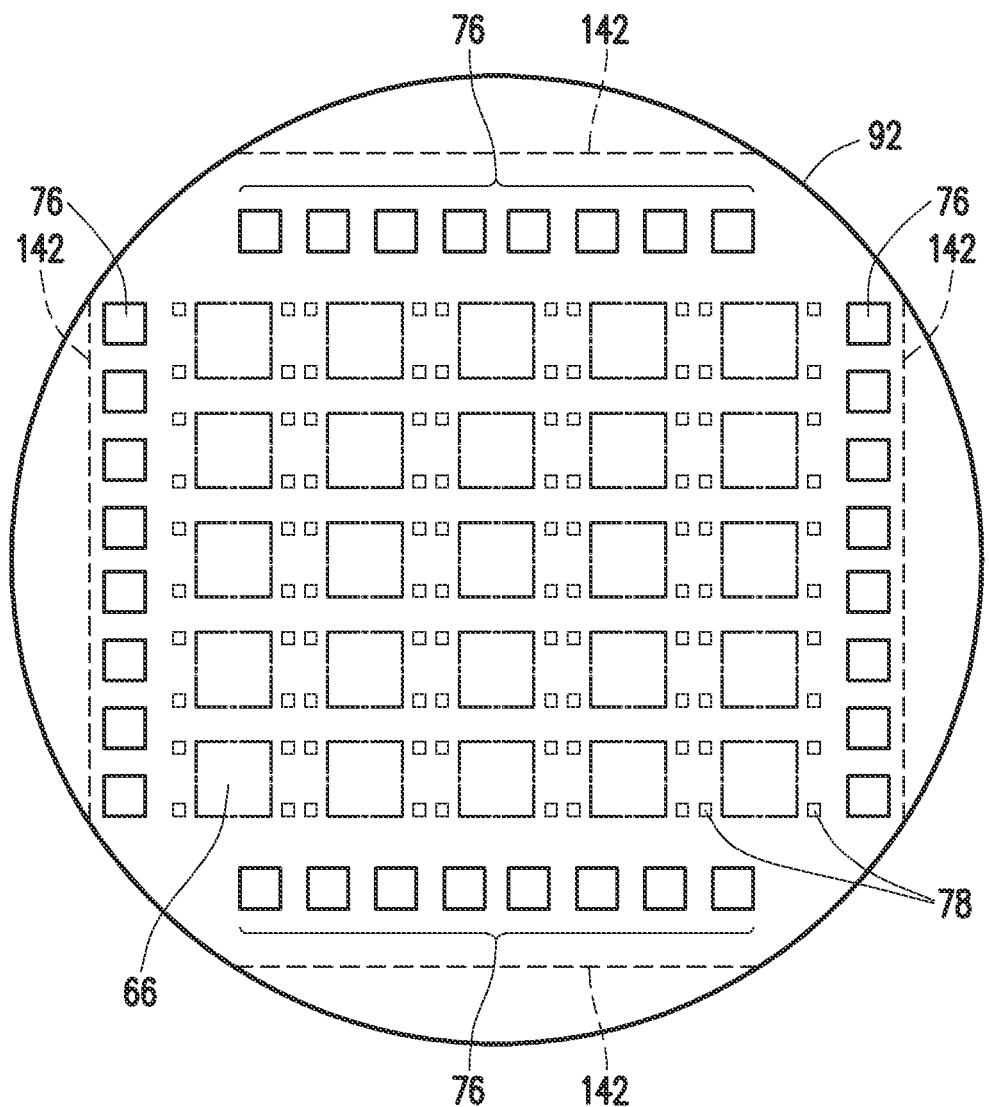
Figure 29:
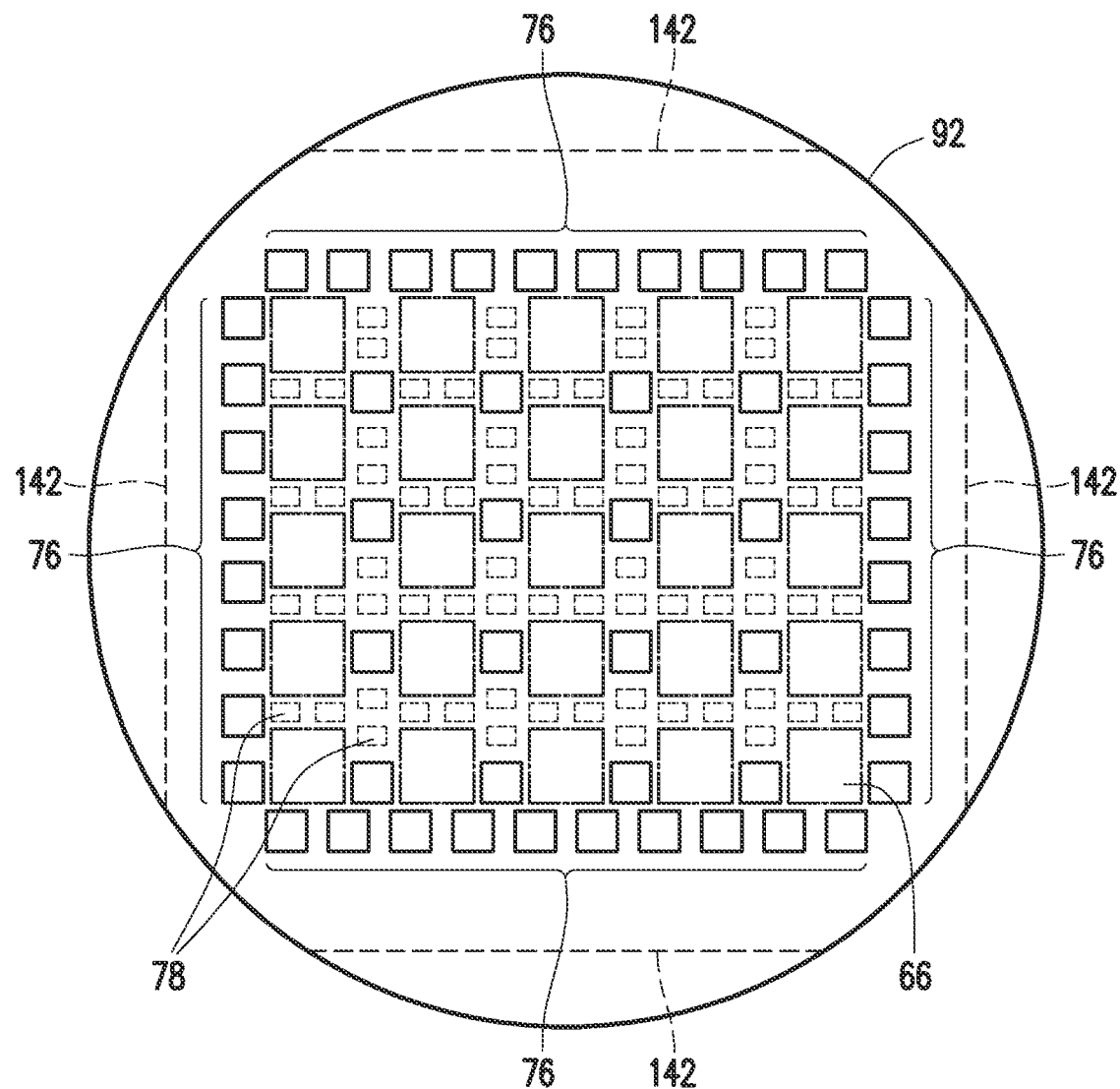

FIG. 25 illustrates an InFO package 92 in which a plurality of building blocks 66 form an array, with no IPD dies and bare dies located between building blocks 66. Bare dies 76, which may be IO dies or other types of device dies, are arranged at the peripheral of the array, and no IO dies and bare dies are placed encircling the array. FIG. 26 illustrates an InFO package 92 in which a plurality of building blocks 66 form an array, with bare dies 76 placed between building blocks 66. Bare dies 76 are also arranged at the peripheral of the array. FIG. 27 illustrates an InFO package 92 in which a plurality of building blocks 66 form an array, and no IO dies and bare dies are placed in the array. Bare dies 76 are arranged aligned to a ring encircling the array of building blocks 66. A plurality of IPD dies 78 are also arranged along a ring encircling the array of building blocks 66. FIG. 28 illustrates an InFO package 92 similar to the InFO package 92 shown in FIG. 25, except that IPD dies 78 are placed inside the array of building blocks 66. FIG. 29 illustrates an InFO package 92 similar to the InFO package 92 shown in FIG. 25, except that both of IPD dies 78 and bare dies 76 are placed inside the array of building blocks 66.

In accordance with some embodiments of the present disclosure, as shown in FIGS. 25, 26, 27, 28, and 29, InFO packages 92 are at wafer level, and have round top view shapes. The InFO packages 92 as formed in the processes shown in FIGS. 16 through 21 are un-sawed, and are used in the wafer-form in accordance with these embodiments. In accordance with other embodiments, the round edges of InFO packages 92 in FIGS. 25, 26, 27, 28, and 29 are cut to reduce the sizes of the resulting system package. Dashed lines 142 represent the straight edges formed by the cutting. In yet alternative embodiments, InFO packages 92 may have rectangular top view shapes. In accordance with these embodiments, a plurality of identical InFO package 92 may be formed simultaneously as a part of a large reconstructed wafer, and are then sawed from the large reconstructed wafer.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. In conventional packages, device dies were bonded to an interposer wafer to form a Chip-on-Wafer (CoW) structure, which is then sawed to separate the interposers in the wafer. The resulting separated CoW structures are then bonded to package substrates to form Chip-on-Wafer-on-Substrate (CoWoS) structures to form a system package. It is appreciated that the device dies in the resulting system package are not able to communicate through the package substrates since the package substrates are separated from each other in the final package. Accordingly, the CoWoS structures are further bonded to a Printed Circuits Board (PCB), and the communication between the CoWoS structures are through the PCB. The signal communication between the device dies thus have to go through multiple components including the interposers, the package substrates, and the PCB. The resulting communication paths are long, which causes the latency in the signal. This makes the high-speed communication difficult, especially for super-large packages. In the embodiments of the present application, the interconnect structure 86 (such as RDLs 84A) may be used for lateral communication between building blocks, and the signal paths, going through fewer components, are very short, making high-speed communication possible.

In addition, in conventional structures, power modules are bonded to PCB, and are at the same level as the CoWoS structures. When super large system packages are formed, the lateral power-supplying paths become very long, sometimes as long as tens of millimeters. This significantly increases the power-supplying paths, and for the applications that draw large currents in short time, the power supplying is not fast enough. In the embodiments of the present disclosure, the power modules are on the opposite sides of an interconnect structure than building blocks and device dies, and the power supplying paths are not much longer than the thickness of the interconnect structure plus the height of solder regions, which power supplying paths may be as small as 1 or 2 millimeters or shorter. The power-supplying ability is thus significantly improved.

In accordance with some embodiments of the present disclosure, a package includes a building block, which includes a device die; an interposer bonded with the device die; and a first encapsulant encapsulating the device die therein. The package further includes a second encapsulant encapsulating the building block therein; an interconnect structure over the second encapsulant, wherein the interconnect structure comprises redistribution lines electrically coupling to the device die; and a power module over the interconnect structure, wherein the power module is electrically coupled to the building block through the interconnect structure. In an embodiment, the building block comprises a plurality of dielectric layers, and a bottom dielectric layer in the plurality of dielectric layers is in physical contact with the second encapsulant and the device die. In an embodiment, the device die is a logic die, and the building block further comprises a memory stack encapsulated in the first encapsulant. In an embodiment, the package further comprises a cold plate; a thermal interface material comprising a first surface contacting a surface of a semiconductor substrate of the device die, and a second surface contacting the cold plate; and a screw penetrating through the second encapsulant, the cold plate, and the thermal interface material. In an embodiment, the package further comprises a plurality of building blocks in the second encapsulant, wherein the plurality of building blocks form an array. In an embodiment, the package further comprises a plurality of power modules at a same level as the power module, wherein the plurality of power modules are electrically coupled to the plurality of building blocks in a one-to-one correspondence. In an embodiment, the package further comprises a metal brace forming a mesh; and a plurality of screws and bolts securing the metal brace to the interconnect structure and the second encapsulant. In an embodiment, the package further comprises a socket bonded to the interconnect structure, with the power module connected to the socket, wherein the metal brace contacts the socket. In an embodiment, the package further comprises a plurality of independent passive device dies encapsulated in the second encapsulant. In an embodiment, the package further comprises a plurality of bare dies encapsulated in the second encapsulant.

In accordance with some embodiments of the present disclosure, a package includes an array of building blocks forming an array, wherein each building block in the array of building blocks comprises a first molding compound; a logic die in the first molding compound; and a memory die in the first molding compound; a second molding compound, with the array of building blocks in the second molding compound; an interconnect structure expanding laterally beyond the array, wherein the interconnect structure comprises a plurality of dielectric layers; and a plurality of redistribution lines in the plurality of dielectric layers and electrically coupling to the array; and a power module outside of the second molding compound, wherein the power module is electrically coupled to the array. In an embodiment, the power module is over the interconnect structure. In an embodiment, the package further comprises a plurality of power modules, with the power module being one of the plurality of power modules, wherein the plurality of power modules overlap the array. In an embodiment, the package further comprises a connector over and bonded to the interconnect structure through solder regions, wherein the connector is configured to provide electrical signals to the array.

In accordance with some embodiments of the present disclosure, a method includes bonding a plurality of device dies to an interposer wafer; encapsulating the plurality of device dies in a first encapsulant; polishing the interposer wafer to reveal through-vias in a substrate of the interposer wafer; forming electrical connectors connecting to the through-vias; singulating the interposer wafer and the first encapsulant to form a building block; encapsulating the building block in a second encapsulant; forming a fan-out interconnect structure over and contacting the second encapsulant; and attaching a power module over the fan-out interconnect structure. In an embodiment, the method further comprises encapsulating an array of building blocks in the second encapsulant, wherein the array of building blocks comprises the building block. In an embodiment, the method further comprises attaching a plurality of power modules over the fan-out interconnect structure, wherein each of the plurality of power modules is electrically connected to one of the array of building blocks. In an embodiment, the method further comprises encapsulating a plurality of bare dies in the second encapsulant. In an embodiment, the method further comprises encapsulating a plurality of independent passive device dies in the second encapsulant. In an embodiment, the method further comprises connecting a connector comprising a plurality of signal paths over the fan-out interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package comprising:
   a building block comprising:
      a device die;
      an interposer bonded with the device die; and
      a first encapsulant encapsulating the device die therein;
   a second encapsulant encapsulating the building block therein;
   an interconnect structure over the second encapsulant, wherein the interconnect structure comprises redistribution lines electrically coupling to the device die; and
   a power module over the interconnect structure, wherein the power module is electrically coupled to the building block through the interconnect structure.
2. The package of claim 1, wherein the building block comprises a plurality of dielectric layers, and a bottom dielectric layer in the plurality of dielectric layers is in physical contact with the second encapsulant and the device die.

3. The package of claim 1, wherein the device die is a logic die, and the building block further comprises a memory stack encapsulated in the first encapsulant.

4. The package of claim 1 further comprising:
a cold plate;
a thermal interface material comprising a first surface contacting a surface of a semiconductor substrate of the device die, and a second surface contacting the cold plate; and
a screw penetrating through the second encapsulant, the cold plate, and the thermal interface material.

5. The package of claim 1 comprising a plurality of building blocks in the second encapsulant, wherein the plurality of building blocks form an array.

6. The package of claim 5 further comprising a plurality of power modules at a same level as the power module, wherein the plurality of power modules are electrically coupled to the plurality of building blocks in a one-to-one correspondence.

7. The package of claim 1 further comprising:
a metal brace forming a mesh; and
a plurality of screws and bolts securing the metal brace to the interconnect structure and the second encapsulant.

8. The package of claim 7 further comprising a socket bonded to the interconnect structure, with the power module connected to the socket, wherein the metal brace contacts the socket.

9. The package of claim 1 further comprising a plurality of independent passive device dies encapsulated in the second encapsulant.

10. The package of claim 1 further comprising a plurality of bare dies encapsulated in the second encapsulant.

11. A package comprising:
an array of building blocks forming an array, wherein each building block in the array of building blocks comprises:
a first molding compound;
a logic die in the first molding compound; and
a memory die in the first molding compound;
a second molding compound, with the array of building blocks in the second molding compound;
an interconnect structure expanding laterally beyond the array, wherein the interconnect structure comprises:
a plurality of dielectric layers; and
a plurality of redistribution lines in the plurality of dielectric layers and electrically coupling to the array; and
a power module outside of the second molding compound, wherein the power module is electrically coupled to the array.

12. The package of claim 11, wherein the power module is over the interconnect structure.

13. The package of claim 11 comprising a plurality of power modules, with the power module being one of the plurality of power modules, wherein the plurality of power modules overlap the array.

14. The package of claim 11 further comprising a connector over and bonded to the interconnect structure through solder regions, wherein the connector is configured to provide electrical signals to the array.

15. A package comprising:
a plurality of building blocks, each comprising:
an interposer;
a plurality of device dies bonded to the interposer;
a first encapsulant encapsulating the plurality of device dies therein, wherein the interposer, the plurality of device dies, and the first encapsulant in combination form one of the plurality of building blocks;
a second encapsulant encapsulating the plurality of building blocks;
a fan-out interconnect structure over and contacting the second encapsulant, wherein the fan-out interconnect structure electrically interconnects the plurality of building blocks; and
a power module over the fan-out interconnect structure.

16. The package of claim 15, wherein the plurality of building blocks form an array.

17. The package of claim 15 further comprising a plurality of power modules over the fan-out interconnect structure, with the power module being one of the plurality of power modules, wherein each of the plurality of power modules is electrically connected to one of the plurality of building blocks.

18. The package of claim 15, wherein the second encapsulant comprises a molding compound.

19. The package of claim 15 further comprising a plurality of independent passive device dies encapsulated in the second encapsulant.

20. The package of claim 15 further comprising a connector comprising a plurality of signal paths, wherein the connector is over and electrically connected to the fan-out interconnect structure.

* * * * *